(12) United States Patent
Kikuchi et al.

(10) Patent No.: US 7,154,247 B2
(45) Date of Patent: Dec. 26, 2006

(54) SECONDARY BATTERY STATE-OF-CHARGE ESTIMATING APPARATUS AND METHOD USING POLARIZATION VOLTAGES, AND RECORDING MEDIUM USABLE THEREBY

(75) Inventors: Yoshiaki Kikuchi, Toyota (JP); Hidenori Takahashi, Okazaki (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 343 days.

(21) Appl. No.: 10/795,219

(22) Filed: Mar. 9, 2004

(65) Prior Publication Data
US 2004/0178798 A1    Sep. 16, 2004

(30) Foreign Application Priority Data
Mar. 11, 2003    (JP)    ............................. 2003-064956

(51) Int. Cl.
  *H01M 10/44*    (2006.01)
  *H01M 10/46*    (2006.01)
(52) U.S. Cl. ...................................... 320/132
(58) Field of Classification Search ................ 320/104, 320/132, 149; 324/426, 433
  See application file for complete search history.

(56) References Cited
U.S. PATENT DOCUMENTS
6,696,818 B1 * 2/2004 Arai et al. .................. 320/132
6,850,038 B1 * 2/2005 Arai et al. .................. 320/132

FOREIGN PATENT DOCUMENTS

| JP | A 8-160113 | 6/1996 |
| JP | A 10-164764 | 6/1998 |
| JP | A 11-346444 | 12/1999 |
| JP | A 2000-258514 | 9/2000 |
| JP | A 2001-272444 | 10/2001 |

* cited by examiner

*Primary Examiner*—Edward H. Tso
(74) *Attorney, Agent, or Firm*—Kenyon & Kenyon LLP

(57) ABSTRACT

When an ignition switch is turned ON, a CPU obtains a battery voltage detected by a voltage sensor and calculates a voltage difference between a battery voltage stored in ROM when the ignition switch was turned off and the obtained battery voltage. The CPU then compares the voltage difference with a determination value. If the voltage difference is less than the determination value, the CPU sets a polarization voltage stored in the ROM before a not-in-use period to a polarization voltage initial value. If the voltage difference is equal to, or greater than, the determination value, on the other hand, the CPU sets the polarization voltage initial value to 0. The CPU then calculates an open circuit voltage of a secondary battery using this polarization voltage initial value, and calculates a state-of-charge of the secondary battery from that calculated open circuit voltage.

35 Claims, 21 Drawing Sheets

SECONDARY BATTERY STATE-OF-CHARGE ESTIMATING APPARATUS AND METHOD USING POLARIZATION VOLTAGES, AND RECORDING MEDIUM USABLE THEREBY

INCORPORATION BY REFERENCE

The disclosure of Japanese Patent Application No. 2003-064956 filed on Mar. 11, 2003, including the specification, drawings and abstract is incorporated herein by reference in its entirety.

BACKGROUND OF THE INVENTION

1. Field of the Invention

The invention relates to a secondary battery state-of-charge estimating apparatus, a secondary battery state-of-charge estimating method, and a recording medium readable by a computer which stores a program for directing the computer to execute a routine according to the secondary battery state-of-charge estimating method. More specifically, the invention relates to an apparatus for estimating the state-of-charge of a secondary battery mounted in an electric vehicle or a hybrid vehicle, a method for estimating a state-of-charge of a secondary battery, and a recording medium readable by a computer which stores a program for directing the computer to execute a routine according to the method for estimating the state-of-charge of the secondary battery.

2. Description of the Related Art

Electric vehicles (hereinafter also abbreviated to "EVs") and hybrid vehicles (hereinafter also abbreviated to "HVs") have recently gained attention as environmentally friendly vehicles. EVs and HVs run by driving a motor using a secondary battery which is mounted in the vehicle as the energy source.

A nickel metal hydride battery or lithium battery or the like, which have superior fundamental characteristics such as energy density, output characteristics and cycle life characteristics is generally used as the secondary battery in an EV or HV. When this type of secondary battery is used as the energy source for a motor for running a vehicle, an accurate estimate of the state-of-charge (hereinafter also abbreviated to "SOC") of the secondary battery is crucial to calculate the possible running distance with the secondary battery and to prevent over-discharge of the secondary battery.

FIG. 27 shows the relationship between the SOC and open circuit voltage (hereinafter also abbreviated to "OCV") of the secondary battery.

Referring to the drawing, because the correlation between the SOC and the OCV is fixed, it is possible to calculate the SOC from the OCV using this relationship. That is, it is possible to detect the battery voltage using a voltage sensor and then calculate the SOC based on the OCV calculated from the detected battery voltage.

In this case, the OCV here is the voltage when the charge and discharge current of the secondary battery is 0 (amperes), i.e., it is the voltage between open terminals excluding the polarization effect inside the battery. That is, the OCV does not necessarily match the value of the battery voltage detected by the voltage sensor due to the polarization effect inside the battery. The relationship between the battery voltage V detected by the voltage sensor and the OCV can generally be expressed with Expression 1 below.

$$V = OCV + VR + VDYN \quad (1)$$

where VR represents to a voltage drop due to internal resistance in the battery, and VDYN represents polarization voltage.

The voltage drop VR depends on the charge and discharge current and is 0 when the terminals are open. On the other hand, the polarization voltage VDYN depends on such factors as the charge and discharge state, amount of current, and temperature at that time. Also, when the secondary battery is left with the terminals open, the polarization voltage VDYN value decreases over time until it finally becomes 0 after enough time has passed. The battery voltage V when the terminals are open and the polarization voltage VDYN is 0 matches the OCV.

As described above, in order to obtain the SOC it is necessary to obtain the OCV, and in order to obtain the OCV it is necessary to accurately estimate the polarization voltage VDYN in particular. As shown in FIG. 27, the amount of change in the SOC is large with respect to the change in the OCV around the working voltage of the secondary battery (i.e., around 15V with a 12-cell battery). Accordingly, accurately estimating the polarization voltage VDYN contributes greatly to improving the accuracy in estimating the SOC. FIG. 28 is a view illustrating the shift in the polarization voltage. Referring to the drawing, the vertical axis denotes the polarization voltage and the horizontal axis denotes time. The temperature is constant. The periods of time T1 to T2 and time T3 to T4 are periods during which the EV or HV is running and the secondary battery is charging and discharging. The periods of time T2 to T3 and time T4 onward are periods during which the EV or HV is not being used and the secondary battery is disconnected from the load (hereinafter, each these periods will also be referred to as a "not-in-use period").

As the secondary battery charges, the polarization voltage increases in the positive direction (hereinafter, when the polarization voltage is positive, it will also be referred to as "charge polarization"). On the other hand, as the secondary battery discharges, the polarization voltage increases in the negative direction (hereinafter, when the polarization voltage is negative, it will also be referred to as "discharge polarization"). During the not-in-use period, the polarization voltage generated at that time does not immediately disappear, but rather gradually decreases toward 0.

As described above, because the polarization voltage depends on the charge and discharge current and temperature, as well as on the charge and discharge history, if the vehicle is running, it is possible to calculate the polarization voltage with a control apparatus using a polarization voltage model derived in advance. During the not-in-use period, however, it is not possible to calculate the change in the polarization voltage during that time due to the fact that the power of the vehicle is off.

In view of this problem, an SOC estimating apparatus disclosed in JP(A) 2001-272444 is provided with a timer that times the not-in-use period. When the not-in-use period that was timed is within a predetermined set period, the OCV or SOC is corrected according to the length of the not-in-use period. When the not-in-use period that was timed is longer than the predetermined set period, it is determined that the polarization has disappeared.

While the apparatus disclosed in JP(A) 2001-272444 does enable the SOC after the not-in-use period to be accurately calculated because the polarization voltage is corrected according to the length of the not-in-use period, it also requires that a timer be provided to time the not-in-use period. Providing a separate timer in this way increases the cost of the control apparatus.

Further, when a timer is not provided and the polarization voltage before the not-in-use period has started is stored and that stored polarization voltage is used after the not-in-use period has ended, the estimation accuracy of the SOC does not deteriorate much when the not-in-use period is short because the change in the polarization voltage is small. When the not-in-use period is long, however, the polarization voltage disappears so a large error is generated in the estimated value of the SOC when the stored value of the polarization voltage was large.

Also, if a timer is not provided and the polarization voltage after the not-in-use period is always made 0, the polarization voltage actually disappears when the not-in-use period is long so there is no problem. When the not-in-use period is short, however, the polarization voltage remains so the estimation accuracy of the SOC greatly deteriorates when the polarization voltage before the not-in-use period was large.

SUMMARY OF THE INVENTION

In view of the foregoing problems, one object of this invention is to provide a secondary battery state-of-charge estimating apparatus which, at a low cost, estimates the SOC taking into account the shift in the polarization voltage.

A further object of the invention is to provide a secondary battery state-of-charge estimating method for accurately estimating the SOC taking into account the polarization effect.

A still further object of the invention is to provide a recording medium readable by a computer in which is stored a routine for directing the computer to execute a secondary battery state-of-charge estimating program for accurately estimating the SOC taking into account the polarization effect.

A secondary battery state-of-charge estimating apparatus, which relates to a first aspect of the invention, is provided with a calculating portion which first calculates a second polarization voltage of a secondary battery at the start of operation of the secondary battery after a not-in-use period based on i) an amount of change in voltage in the secondary battery during the not-in-use period of the secondary battery, and ii) a first polarization voltage of the secondary battery when the secondary battery is operated, and then calculates the state-of-charge of the secondary battery at the start of operation using the second polarization voltage.

The first polarization voltage in the first aspect of the invention may also be the polarization voltage at the end of operation of the secondary battery.

The secondary battery state-of-charge estimating apparatus in the first aspect of the invention may also be further provided with a voltage detecting portion that detects a battery voltage generated between terminals of the secondary battery, and a storage portion that stores i) a first battery voltage detected by the voltage detecting portion at the end of operation of the secondary battery, and ii) the first polarization voltage. Further, the calculating portion may be configured to calculate the second polarization voltage based on i) a voltage difference between the first battery voltage stored in the storage portion and a second battery voltage detected by the voltage detecting portion at the start of operation, and ii) the first polarization voltage stored in the storage portion. Here, the calculating portion may also set the value of the second polarization voltage to be the same as the value of the first polarization voltage when the absolute value of the voltage difference is less than a predetermined value. Also, the calculating portion may set the value of the second polarization voltage to 0 when the absolute value of the voltage difference is equal to, or greater than, the predetermined value.

Further, when a first or second condition is fulfilled, the calculating portion may set the value of the second polarization voltage to the difference value between the first polarization voltage and the voltage difference. The first condition may be that the first polarization voltage be a positive value and the voltage difference be equal to, or greater than, 0 but equal to, or less than, a predetermined value. The second condition may be that the first polarization voltage be equal to, or less than, 0 and the voltage difference be equal to, or less than, 0 but equal to, or greater than, the predetermined value.

Further, when a first or second condition is fulfilled, the calculating portion may set the second polarization voltage to 0. The first condition may be that the first polarization voltage be a positive value and the voltage difference be equal to, or greater than, 0 and greater than a predetermined value. The second condition may be that the first polarization voltage be equal to, or less than, 0 and the voltage difference be a positive value.

Also, the calculating portion may include a determining portion that determines whether there is an abnormality in the secondary battery. When a first or second condition is fulfilled, the determining portion may determine that there is an abnormality in the secondary battery. The first condition may be that the first polarization voltage be a positive value and the voltage difference be a negative value. The second condition may be that the first polarization voltage be equal to, or less than, 0 and the voltage difference be equal to, or less than, 0 and less than a predetermined value.

Further, the apparatus in the first aspect of the invention may further be provided with a voltage detecting portion that detects a battery voltage generated between terminals of the secondary battery, and a storage portion that stores a first polarization voltage and an open circuit voltage of the secondary battery at the end of operation of the secondary battery. Further, the calculating portion may be configured to calculate the second polarization voltage based on i) a voltage difference between a second battery voltage detected by the voltage detecting portion at the start of operation and the open circuit voltage stored in the storage portion, and ii) the first polarization voltage stored in the storage portion.

Here, when a first or second condition is fulfilled, the calculating portion may set the value of the second polarization voltage to the value of the voltage difference. The first condition may be that the first polarization voltage be a positive value and the voltage difference be equal to, or greater than, 0 but equal to, or less than, a predetermined value. The second condition may be that the first polarization voltage be equal to, or less than, 0 and the voltage difference be equal to, or less than, 0 but equal to, or greater than, the predetermined value.

Also, when a first or second condition is fulfilled, the calculating portion may set the second polarization voltage to 0. The first condition may be that the first polarization voltage be a positive value and the voltage difference be a negative value. The second condition may be that the first polarization voltage be equal to, or less than, 0 and the voltage difference be equal to, or less than, 0 and less than a predetermined value.

Further, the calculating portion may also include a determining portion that determines whether there is an abnormality in the secondary battery. When a first or second condition is fulfilled, the determining portion may determine that there is an abnormality in the secondary battery. The first condition may be that the first polarization voltage be a positive value and the voltage difference be equal to, or greater than, 0 and greater than a predetermined value. The second condition may be that the first polarization voltage be equal to, or less than, 0 and the voltage difference be a positive value.

The predetermined value that is compared with the voltage difference may be the value of the first polarization voltage. The secondary battery may be mounted in an electric vehicle or a hybrid vehicle and the not-in-use period may be the period during which the electric vehicle or the hybrid vehicle is not in use.

Also, a secondary battery state-of-charge estimating method, which relates to a second aspect of the invention, includes the steps of: 1) detecting a first battery voltage generated between terminals of a secondary battery at the end of operation of the secondary battery, 2) detecting a second battery voltage generated between the terminals at the start of operation after a not-in-use period of the secondary battery, 3) calculating a voltage difference between the first and second battery voltages, 4) calculating a second polarization voltage of the secondary battery at the start of operation based on the voltage difference and a first polarization voltage of the secondary battery at the end of operation, and 5) calculating a state-of-charge of the secondary battery at the start of operation using the second polarization voltage.

In the second aspect of the invention, step 4 may include the sub-steps of: 4a) making the value of the second polarization voltage equal to the difference value between the first polarization voltage and the voltage difference when the first polarization voltage is a positive value and the voltage difference is equal to, or greater than, 0 but equal to, or less than, a predetermined value, and 4b) making the value of the second polarization voltage equal to the difference value when the first polarization voltage is equal to, or less than, 0 and the voltage difference is equal to, or less than, 0 but equal to, or greater than, the predetermined value.

Also in the second aspect of the invention, step 4 may also include the sub-steps of: 4a) making the second polarization voltage 0 when the first polarization voltage is a positive value and the voltage difference is equal to, or greater than, 0 and greater than a predetermined value, and 4b) making the second polarization voltage 0 when the first polarization voltage is equal to, or less than, 0 and the voltage difference is a positive value.

Further, the method in the second aspect of the invention may also include the steps of: 6) determining that there is an abnormality in the secondary battery when the first polarization voltage is a positive value and the voltage difference is a negative value, and 7) determining that there is an abnormality in the secondary battery when the first polarization voltage is equal to, or less than, 0 and the voltage difference is equal to, or less than, 0 and less than a predetermined value.

Also, a secondary battery state-of-charge estimating method, which relates to a third aspect of the invention, includes the steps of: 1) detecting a battery voltage generated between terminals of a secondary battery at the start of operation after a not-in-use period of the secondary battery, 2) calculating a voltage difference between the battery voltage and an open circuit voltage of the secondary battery at the end of operation of the secondary battery, 3) calculating a second polarization voltage of the secondary battery at the start of operation based on the voltage difference and the first polarization voltage of the secondary battery at the end of operation, and 4) calculating a state-of-charge of the secondary battery at the start of operation using the second polarization voltage.

In the third aspect of the invention, step 3 may also include the sub-steps of: 3a) making the value of the second polarization voltage equal to the value of the voltage difference when the first polarization voltage is a positive value and the voltage difference is equal to, or greater than, 0 but equal to, or less than, a predetermined value, and 3b) making the value of the second polarization voltage equal to the value of the voltage difference when the first polarization voltage is equal to, or less than, 0 and the voltage difference is equal to, or less than, 0 but equal to, or greater than, the predetermined value.

Also in the third aspect of the invention, step 3 may also include the sub-steps of: 3a) making the second polarization voltage 0 when the first polarization voltage is a positive value and the voltage difference is a negative value, and 3b) making the second polarization voltage 0 when the first polarization voltage is equal to, or less than, 0 and the voltage difference is equal to, or less than, 0 and less than a predetermined value.

Further, the method in the third aspect of the invention may also include the steps of: 5) determining that there is an abnormality in the secondary battery when the first polarization voltage is a positive value and the voltage difference is a equal to, or greater than, 0 and greater than a predetermined value, and 6) determining that there is an abnormality in the secondary battery when the first polarization voltage is equal to, or less than, 0 and the voltage difference is a positive value.

A recording medium, which relates to a fourth aspect of the invention, records a program for directing a computer to execute a routine according to the secondary battery state-of-charge estimating method according to either the second or third aspect of the invention.

BRIEF DESCRIPTION OF THE DRAWINGS

The above-mentioned embodiment and other embodiments, objects, features, advantages, technical and industrial significance of this invention will be better understood by reading the following detailed description of the preferred embodiments of the invention, when considered in connection with the accompanying drawings, in which.

DETAILED DESCRIPTION OF THE PREFERRED EMBODIMENTS

Figure 1:
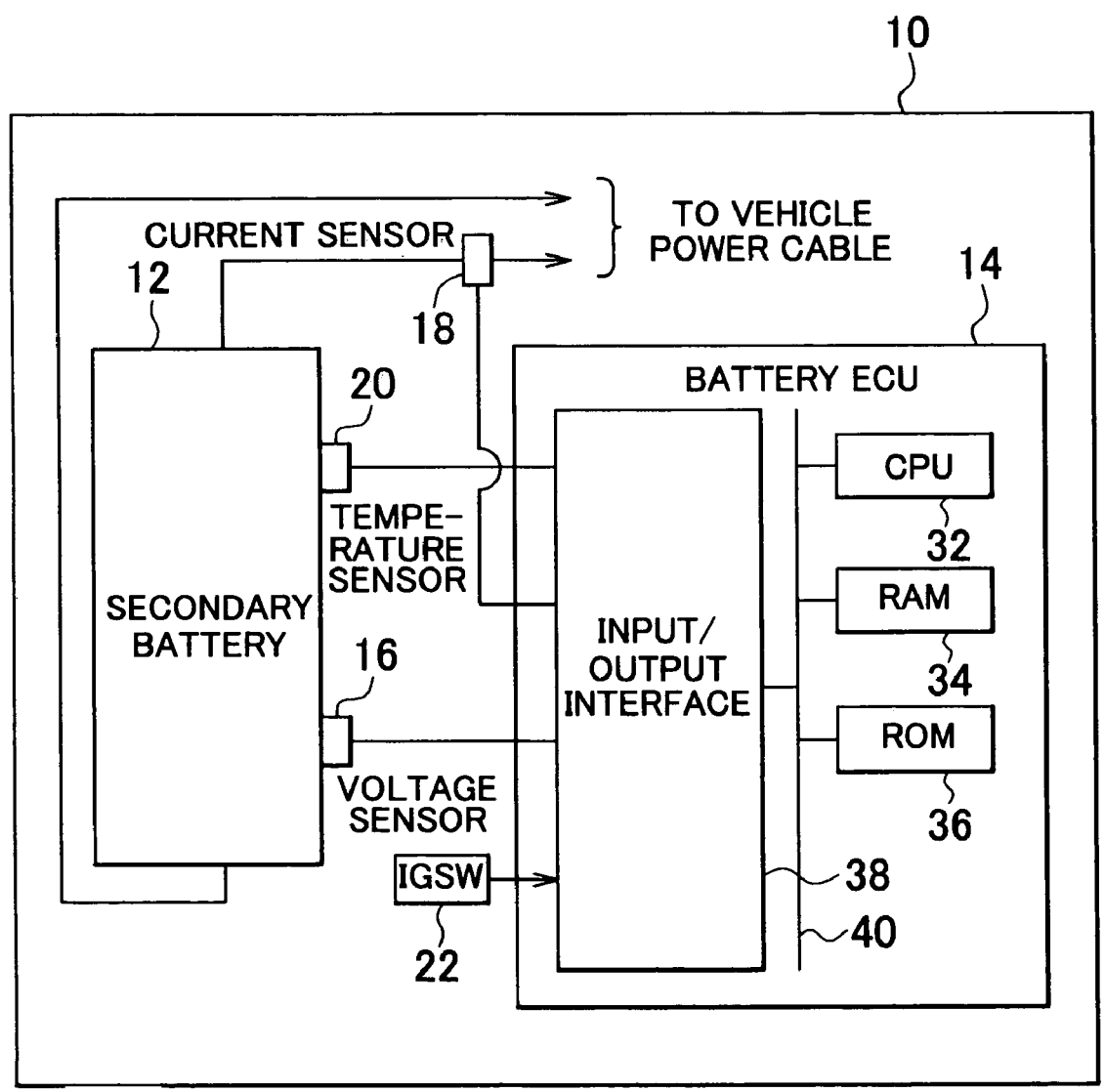
FIG. 1 is a block diagram schematically showing the overall structure of a vehicle power unit including a battery ECU that serves as a state-of-charge estimating apparatus according to this invention.

In the following description and the accompanying drawings, the present invention will be described in more detail in terms of exemplary embodiments. Like parts in the drawings will be denoted with like reference numerals and redundant descriptions thereof will be omitted.

[First Embodiment]

FIG. 1 is a block diagram schematically showing the overall structure of a vehicle power unit including a battery ECU (electronic control unit) that serves as a state-of-charge estimating apparatus according to this invention.

Referring to the drawing, a power unit 10 includes a secondary battery 12, a battery ECU 14, a voltage sensor 16, a current sensor 18, a temperature sensor 20, and an ignition switch 22. The battery ECU 14 includes a CPU (Central Processing Unit) 32, RAM (Random Access Memory) 34, ROM (Read Only Memory) 36, an input/output interface 38, and a bus 40.

The secondary battery 12 is a nickel metal hydride battery. A power terminal of the secondary battery 12 is connected to a vehicle power cable via a relay, not shown. The secondary battery 12 supplies power to the driving motor and various auxiliary electronic components and the like in the vehicle.

The voltage sensor 16 detects a battery voltage of the secondary battery 12 and outputs a signal indicative thereof to the input/output interface 38 of the battery ECU 14. The current sensor 18 detects a charge and discharge current of the secondary battery 12 and outputs a signal indicative thereof to the input/output interface 38. The temperature sensor 20 detects a temperature of the secondary battery 12 and outputs a signal indicative thereof to the input/output interface 38. The ignition switch 22 is a power switch of the vehicle in which the power unit 10 is mounted, and is connected to the input/output interface 38.

The CPU 32 receives signals indicative of the battery voltage, charge and discharge current, and temperature from the voltage sensor 16, the current sensor 18, and the temperature sensor 20, respectively, via the input/output interface 38 and the bus 40, and calculates the OCV based on Expression 1 above. Here, the voltage drop VR and the polarization voltage VDYN in Expression 1 are modeled in advance and those model expressions are stored in the ROM 36. The voltage drop VR is a function that depends on the current. The polarization voltage VDYN is a coefficient that depends on the current and the temperature, and is calculated from the last calculated value using the past records of the current and temperature. As described above, the polarization voltage changes during the not-in-use period of the secondary battery so the initial value of the polarization voltage is calculated based on the last calculated value after the end of the not-in-use period (i.e., at the start of vehicle operation) and before the not-in-use period. After the CPU 32 calculates the OCV, the CPU 32 then calculates the SOC from the calculated OCV using an OCV-SOC map stored in advance in the ROM 36.

Further, the CPU 32 also calculates the SOC by adding up the current values received from the current sensor 18 via the input/output interface 38 and the bus 40. With respect to the use of the SOC calculated by adding up the current values and the SOC calculated based on Expression 1 above, the initial value of the SOC after activation of the power unit 10 is calculated based on Expression 1 and the change in the SOC following charge and discharge of current is calculated by adding the current to that initial value. Also, the SOC calculated based on Expression 1 may also be used as a reference value for the SOC at a predetermined checkpoint (e.g., when the SOC has reached a predetermined value).

The RAM 34 is the working memory that is used when the CPU 32 performs the various calculations. The ROM 36 is nonvolatile memory such as flash memory or the like. The ROM 36 stores the various model expressions, the OCV-SOC map, and a determination value $\Delta VC$ of the voltage difference, to be described later, and the like all necessary for calculating the OCV. The input/output interface 38 serves as the interface between the battery ECU 14 and various other components such as the sensors, switches and secondary battery. The bus 40 connects the CPU 32, RAM 34, ROM 36, and input/output interface 38 and transmits data therebetween.

In the above description, the voltage sensor 16 constitutes the "voltage detecting portion", the CPU 32 constitutes the "calculating portion", and the ROM 36 constitutes the "storage portion".

Figure 2:
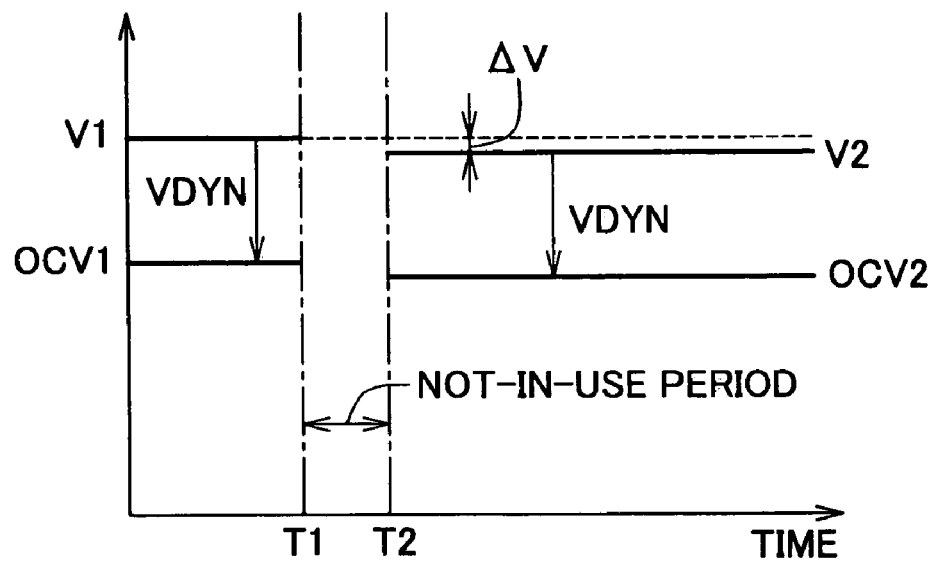
FIG. 2 is a graph illustrating the concept behind a state-of-charge estimating calculation according to a first exemplary embodiment of the invention when the not-in-use period is short.
Figure 3:
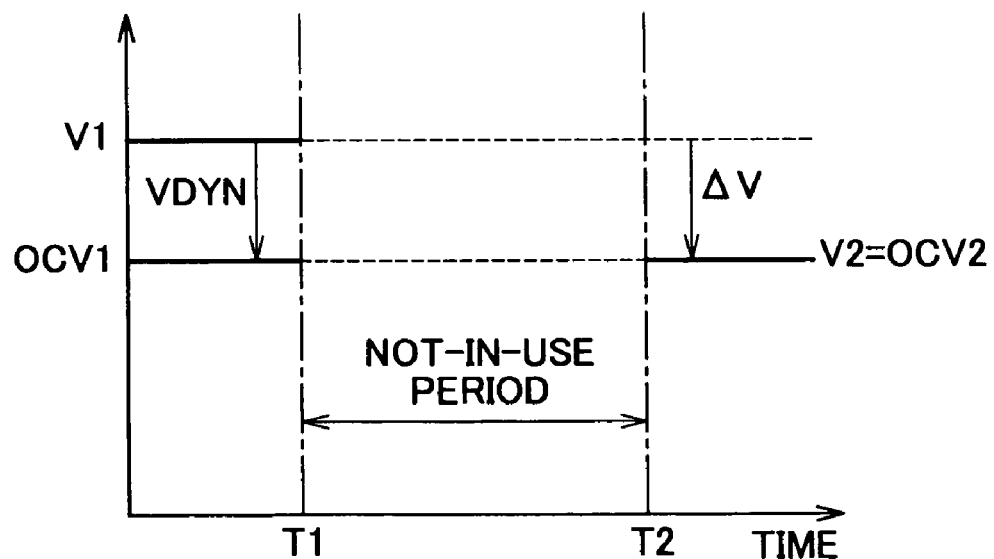
FIG. 3 is a graph illustrating the concept behind a state-of-charge estimating calculation according to the first exemplary embodiment of the invention when the not-in-use period is long.

FIGS. 2 and 3 are graphs illustrating the concepts behind the state-of-charge estimating calculation according to the first exemplary embodiment of the invention. FIG. 2 is a graph illustrating a case in which the not-in-use period is short and FIG. 3 is a graph illustrating a case in which the not-in-use period is long.

Referring to FIG. 2, the period from time T1 to T2 is a period during which the secondary battery 12 is not in use (i.e., a not-in-use period) and the secondary battery 12 is disconnected from the load. Prior to time T1, the battery voltage is V1 and the polarization voltage is VDYN. The not-in-use period T1 to T2 is short and the voltage difference $\Delta V$ between a battery voltage V2 at time T2 and the battery voltage V1 before the not-in-use period is small.

Therefore, when the absolute value of the voltage difference $\Delta V$ is less than the predetermined determination value $\Delta VC$, the polarization voltage is thought not to have disappeared so the polarization voltage at time T2 after the not-in-use period is made equal to the polarization voltage VDYN before the not-in-use period. Therefore, the OCV after the not-in-use period becomes equal to the difference of V2−VDYN and the SOC can be calculated from this OCV using the OCV-SOV map.

Referring to FIG. 3, in this case, the not-in-use period T1 to T2 is long and the voltage difference $\Delta V$ between the battery voltage V2 at time T2 and the battery voltage V1 before the not-in-use period is large. Therefore, when the absolute value of the voltage difference $\Delta V$ is equal to, or greater than, the predetermined determination value $\Delta VC$, the polarization voltage is thought to have disappeared so the polarization voltage at time T2 after the not-in-use period is made 0. Accordingly, the OCV after the not-in-use period becomes equal to V2 and the SOC can be calculated from this OCV using the OCV-SOV map.

Figure 4:
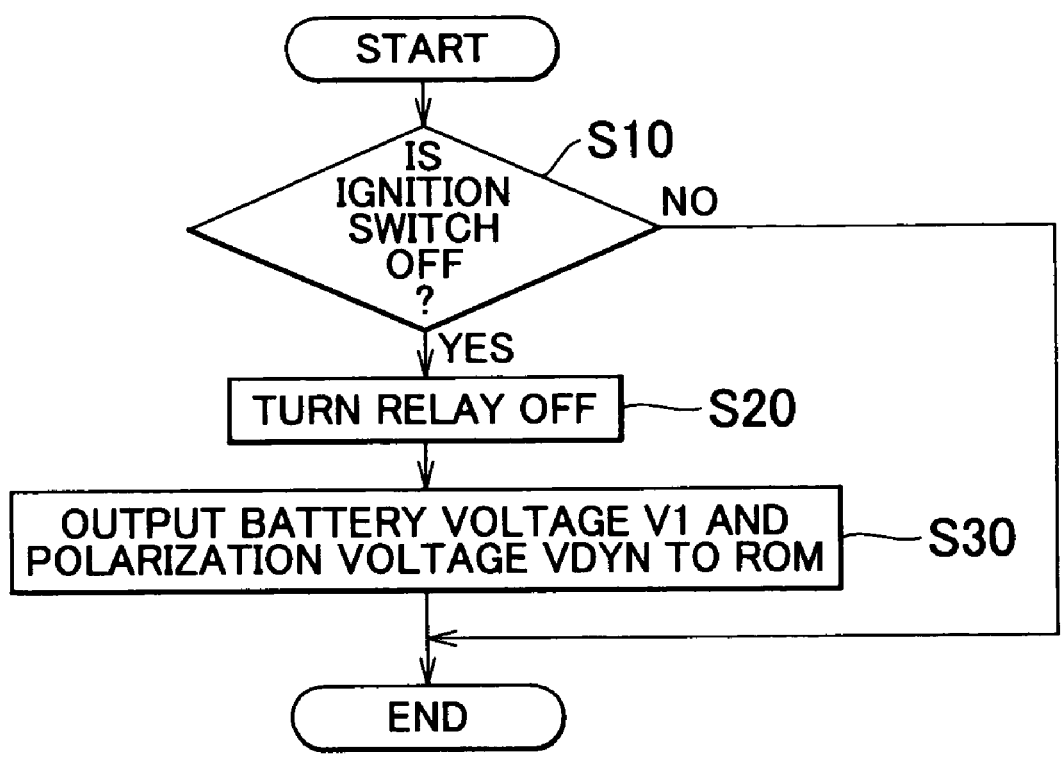
FIG. 4 is a first flowchart of a state-of-charge estimating method followed by the battery ECU according to the first exemplary embodiment of the invention.
Figure 5:
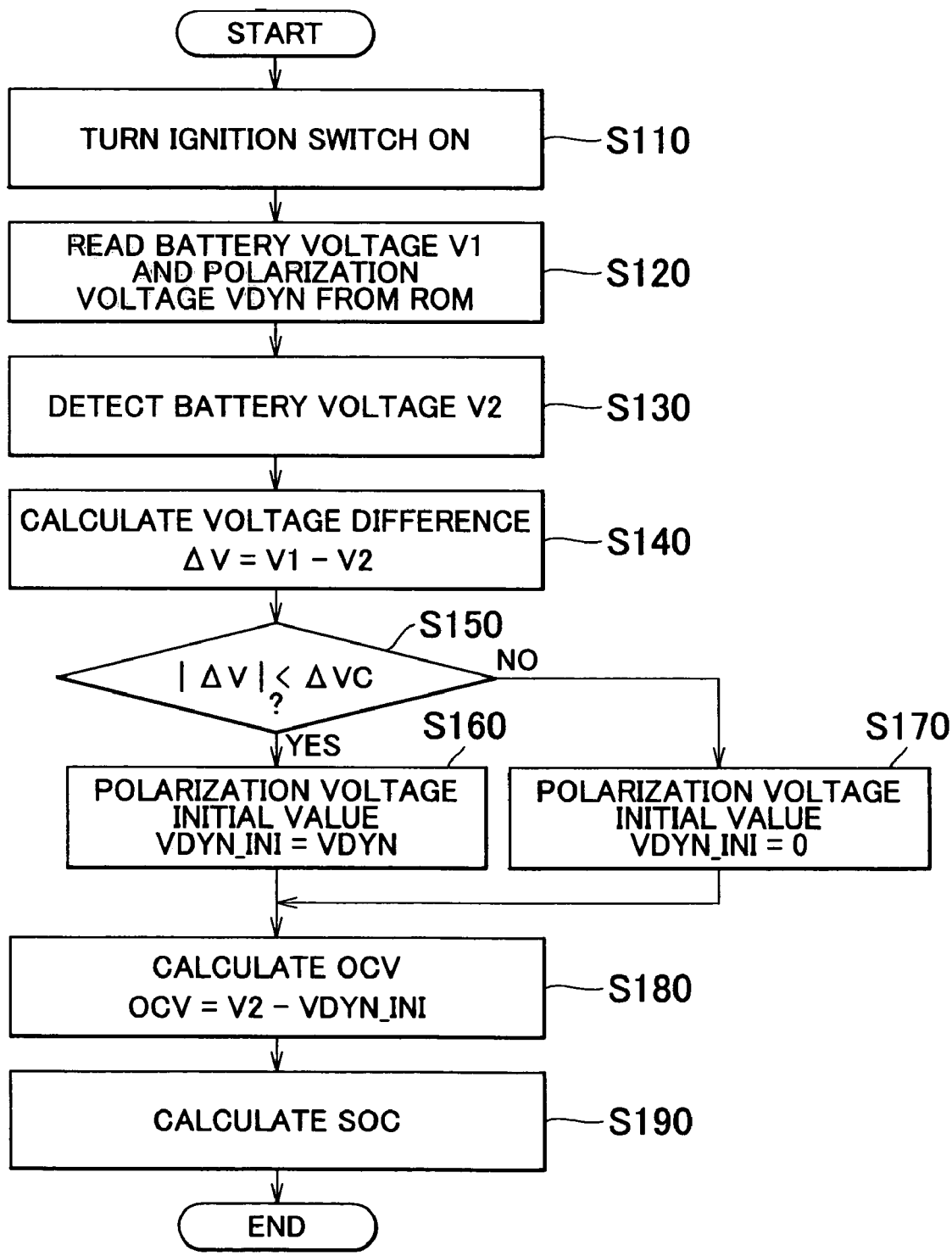
FIG. 5 is a second flowchart of the state-of-charge estimating method followed by the battery ECU according to the first exemplary embodiment of the invention.

FIGS. 4 and 5 are flowcharts of the state-of-charge estimating method followed by the battery ECU according to the first exemplary embodiment of the invention.

Referring to FIG. 4, when the CPU 32 receives a "switch off" signal from the ignition switch 22 via the input/output interface 38 (step S10), it turns off the relay that connects the secondary battery 12 with the vehicle power cable (step S20). The CPU 32 then outputs the battery voltage V1 detected by the voltage sensor 16 and the polarization voltage VDYN to the ROM 36 via the bus 40 (step S30). Those values are then stored in the ROM 36. Then after the battery voltage V1 and the polarization voltage VDYN have been written in the ROM 36, the power of the power unit 10 is turned off.

Referring to FIG. 5, when the ignition switch 22 is turned on (step S110), the CPU 32 reads the battery voltage V1 and the polarization voltage VDYN stored in the ROM 36 from the ROM 36 into the RAM 34 (step S120). Further, the CPU 32 obtains the battery voltage V2 detected by the voltage sensor 16 via the input/output interface 38 and reads it into the RAM 34 (step S130), and then calculates the voltage difference $\Delta V$ between the battery voltages V1 and V2 (step S140).

The CPU 32 then reads the determination value $\Delta VC$ stored in the ROM 36 from the ROM 36 into the RAM 34 and compares the absolute value of the voltage difference $\Delta V$ with the determination value $\Delta VC$ (step S150). If the CPU 32 determines that the absolute value of the voltage difference $\Delta V$ is less than the determination value $\Delta VC$, it sets a polarization voltage initial value VDYN_INI equal to the polarization voltage VDYN before the not-in-use period (step S160). On the other hand, if the CPU 32 determines in step S150 that the absolute value of the voltage difference $\Delta V$ is equal to, or greater than, the determination value $\Delta VC$, it sets the polarization voltage initial value VDYN_INI to 0 (step S170).

After the CPU 32 calculates the polarization voltage initial value VDYN_INI, the CPU 32 then calculates the OCV using that calculated polarization voltage initial value VDYN_INI and the battery voltage V2 (step S180). More specifically, the OCV is calculated according to the expression OCV=V2−VDYN_INI based on Expression 1 above. The CPU 32 then reads the OCV-SOC map from the ROM 36 into the RAM 34 and calculates the SOC from the calculated OCV (step S190).

The determination value $\Delta VC$ may be a fixed value set beforehand or a value corresponding to the polarization voltage VDYN before the not-in-use period.

Further, the voltage detection before the not-in-use period is described above as being done after the relay is turned off but it may also be done before the relay is turned off. In this case, the value of the difference of the voltage drop VR subtracted from the detected voltage may be used as the battery voltage V1.

As described above, according to the first exemplary embodiment, the presence or absence of the polarization voltage after the not-in-use period is estimated based on the voltage difference in the secondary battery before and after the not-in-use period. As a result, the SOC can be estimated without having to provide a timer to time the not-in-use period, and therefore at a low cost.

[Second Embodiment]

In the first exemplary embodiment, the polarization voltage is either made the value immediately before the not-in-use period or 0 depending on the voltage difference of the battery voltage before and after the not-in-use period. In a second exemplary embodiment, the polarization voltage after the not-in-use period is calculated using the voltage difference. Accordingly, the estimation accuracy of the OCV improves, which in turn results in improved estimation accuracy of the SOC.

The structure of the power unit according to the second exemplary embodiment is the same as the structure of the power unit 10 according to the first exemplary embodiment.

FIGS. 6 to 9 are graphs illustrating the concept behind the state-of-charge estimating calculation according to the second exemplary embodiment of the invention. In the drawings, the polarization voltage VDYN before the not-in-use period is a positive value, i.e., a case of charge polarization is shown. Also, the period during time T1 to T2 in the drawings corresponds to a not-in-use period.

Figure 6:
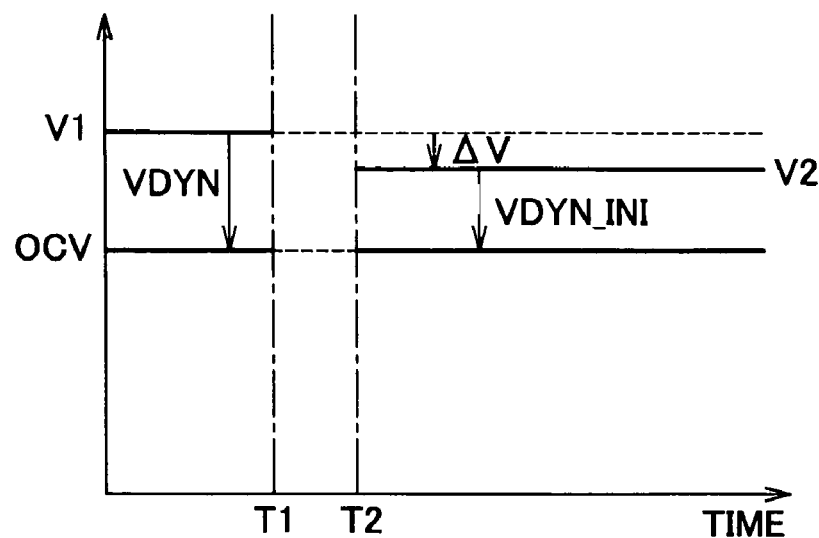
FIG. 6 is a graph illustrating the concept behind a state-of-charge estimating calculation according to a second exemplary embodiment of the invention when there is a charge polarization and the not-in-use period is short.

Referring to FIG. 6, the voltage difference ΔV between the battery voltage V1 before the not-in-use period and the battery voltage V2 after the not-in-use period is thought to be due to the decrease in the polarization voltage. The polarization voltage VDYN_INI after the not-in-use period is made a value that is the difference of the voltage difference ΔV subtracted from the polarization voltage VDYN before the not-in-use period. Therefore, the OCV after the not-in-use period becomes equal to the difference of V2−VDYN_INI and the SOC can be calculated from this OCV using the OCV-SOV map.

Figure 7:
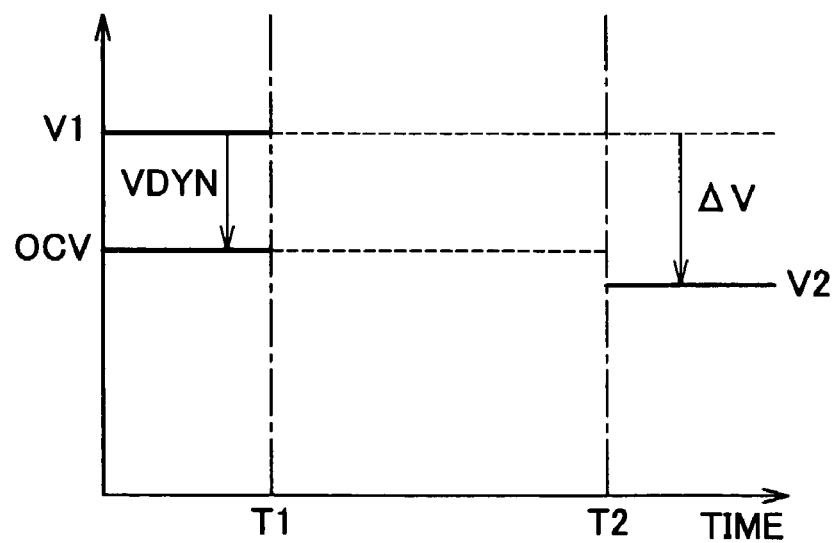
FIG. 7 is a graph illustrating the concept behind a state-of-charge estimating calculation according to the second exemplary embodiment of the invention when there is a charge polarization and the not-in-use period is long.

Referring to FIG. 7, however, when the voltage difference ΔV is greater than the polarization voltage VDYN before the not-in-use period, it is thought that the polarization voltage has disappeared, and further, that the secondary battery has self-discharged, so the polarization voltage VDYN_INI after the not-in-use period is made 0. Therefore, the OCV after the not-in-use period becomes equal to V2 and the SOC can be calculated from this OCV using the OCV-SOV map.

Figure 8:
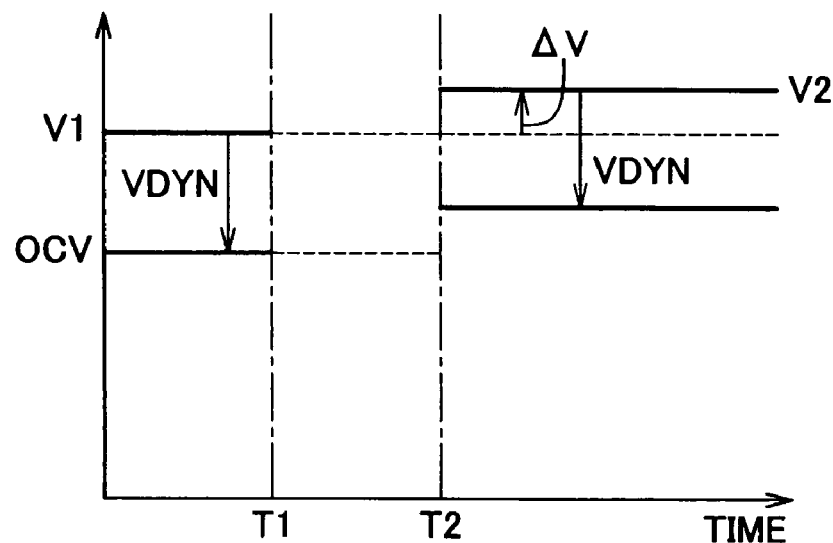
FIG. 8 is a graph illustrating the concept behind a state-of-charge estimating calculation according to the second exemplary embodiment of the invention when there is a charge polarization and an abnormality.
Figure 9:
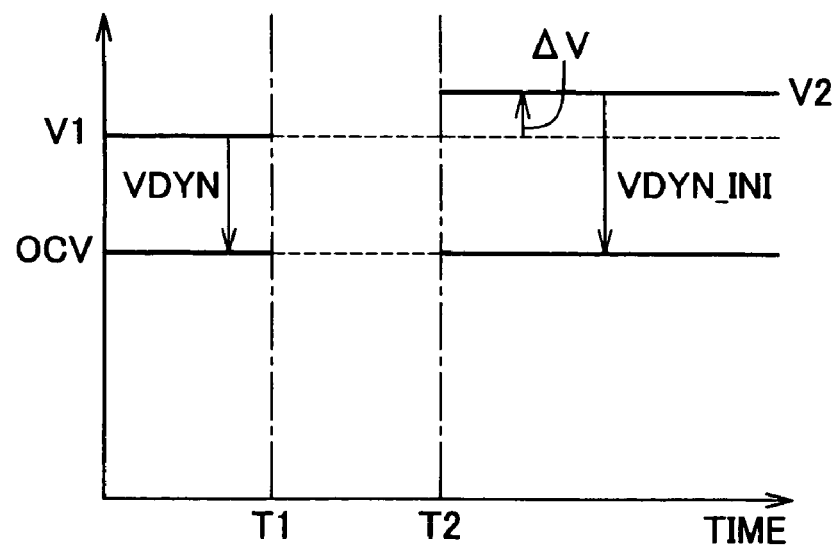
FIG. 9 is a graph illustrating another concept behind a state-of-charge estimating calculation according to the second exemplary embodiment of the invention when there is a charge polarization and an abnormality.

Referring to FIG. 8, on the other hand, a case in which the voltage difference ΔV is a negative value is ordinarily inconceivable so it is thought that some sort of abnormality has occurred. In this case, various countermeasures are possible. In FIG. 8, it is presumed that the polarization voltage before the not-in-use period is correct so the polarization voltage VDYN_INI after the not-in-use period is made VDYN. In FIG. 9, on the other hand, it is presumed that the OCV before the not-in-use period is correct, so the polarization voltage VDYN_INI after the not-in-use period is made equal to the difference of VDYN−ΔV. Further, although not specifically shown, the polarization voltage VDYN_INI may also be reset to 0.

Figure 10:
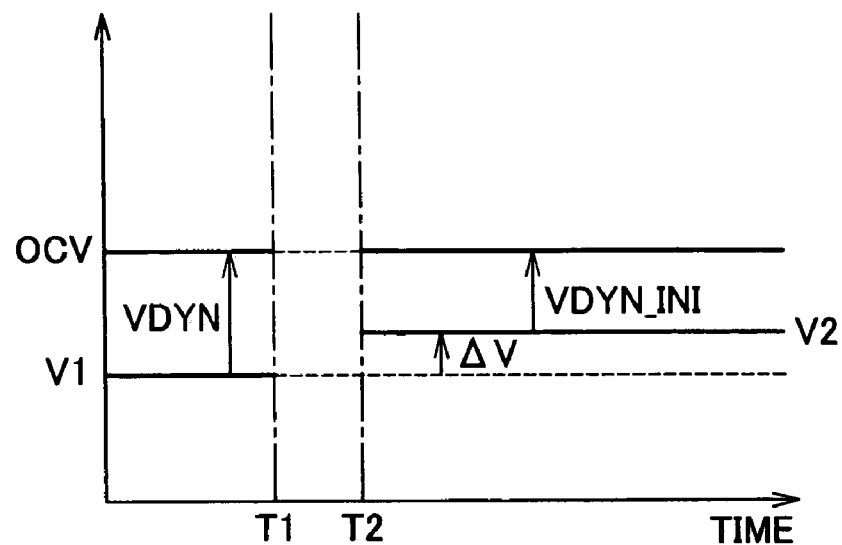
FIG. 10 is a graph illustrating the concept behind a state-of-charge estimating calculation according to the second exemplary embodiment of the invention when there is a discharge polarization and the not-in-use period is short.
Figure 11:
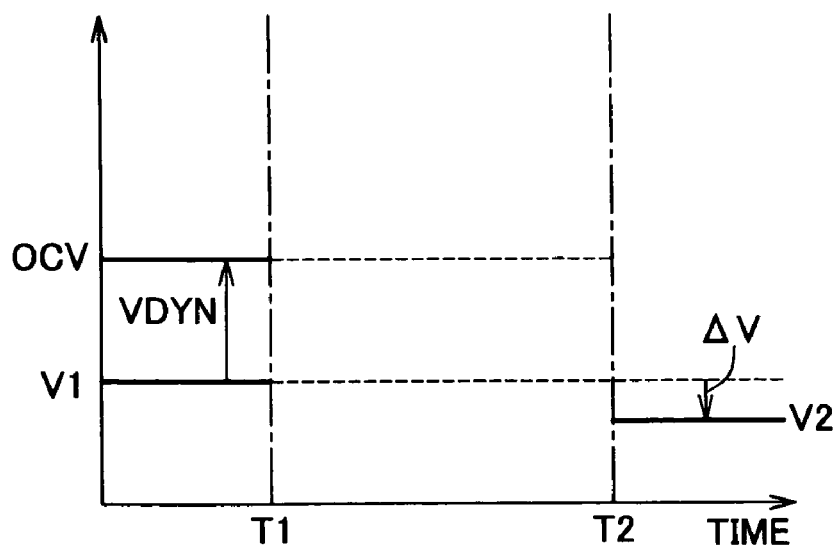
FIG. 11 is a graph illustrating the concept behind a state-of-charge estimating calculation according to the second exemplary embodiment of the invention when there is a discharge polarization and the not-in-use period is long.
Figure 12:
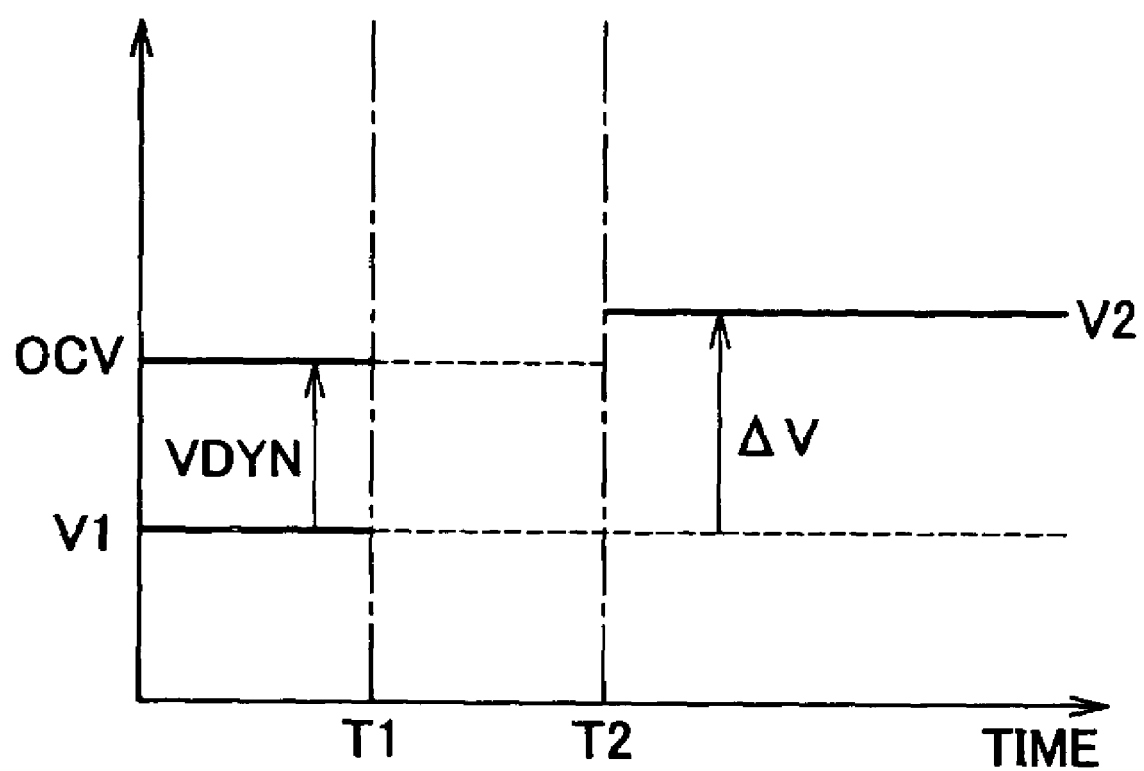
FIG. 12 is a graph illustrating the concept behind a state-of-charge estimating calculation according to the second exemplary embodiment of the invention when there is a discharge polarization and an abnormality.

FIGS. 10 to 12 are also graphs illustrating the concept behind the state-of-charge estimating calculation according to the second exemplary embodiment of the invention. In the drawings, the polarization voltage VDYN before the not-in-use period is a negative value, i.e., a case of discharge polarization is shown. Also, the period during time T1 to T2 in the drawings corresponds to a not-in-use period.

Referring to FIG. 10, the voltage difference ΔV between the battery voltage V1 before the not-in-use period and the battery voltage V2 after the not-in-use period is thought to be due to the decrease in the polarization voltage. The polarization voltage VDYN_INI after the not-in-use period is made a value of the difference of the voltage difference ΔV subtracted from the polarization voltage VDYN before the not-in-use period. Therefore, the OCV after the not-in-use period becomes equal to the difference of V2−VDYN_INI and the SOC can be calculated from this OCV using the OCV-SOV map.

Referring to FIG. 11, however, when the voltage difference ΔV is a positive value, it is thought that the polarization voltage has disappeared, and further, that the secondary battery has self-discharged, so the polarization voltage VDYN_INI after the not-in-use period is made 0. Therefore, the OCV after the not-in-use period becomes equal to V2 and the SOC can be calculated from this OCV using the OCV-SOV map.

Referring to FIG. 12, on the other hand, a case in which the voltage difference ΔV is a negative value and is less than the polarization voltage VDYN before the not-in-use period is ordinarily inconceivable so it is thought that some sort of abnormality has occurred. In this case, the polarization voltage VDYN_INI may be reset to 0.

Figure 13:
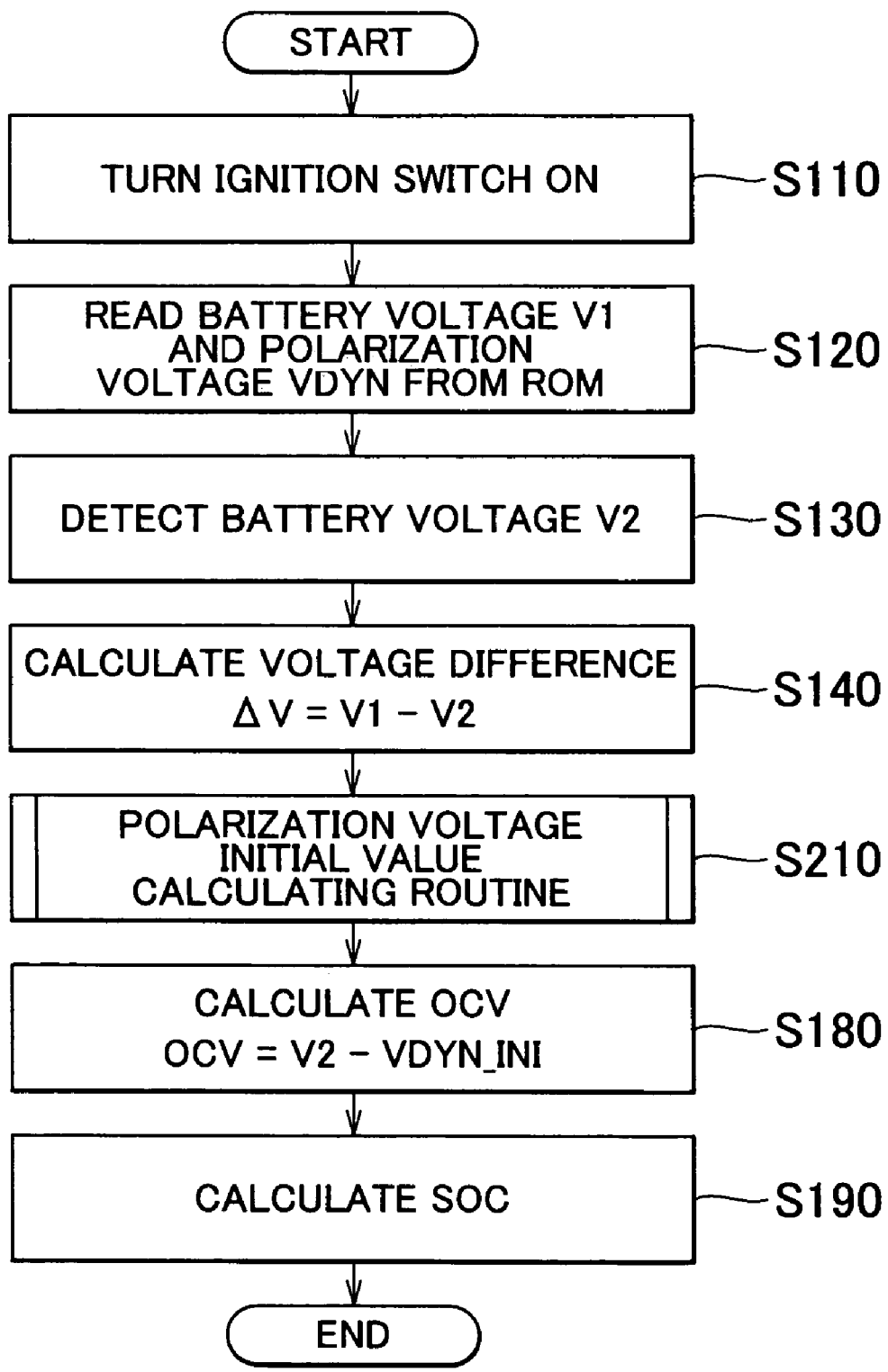
FIG. 13 is a first flowchart of the state-of-charge estimating method followed by the battery ECU according to the second exemplary embodiment of the invention.
Figure 14:
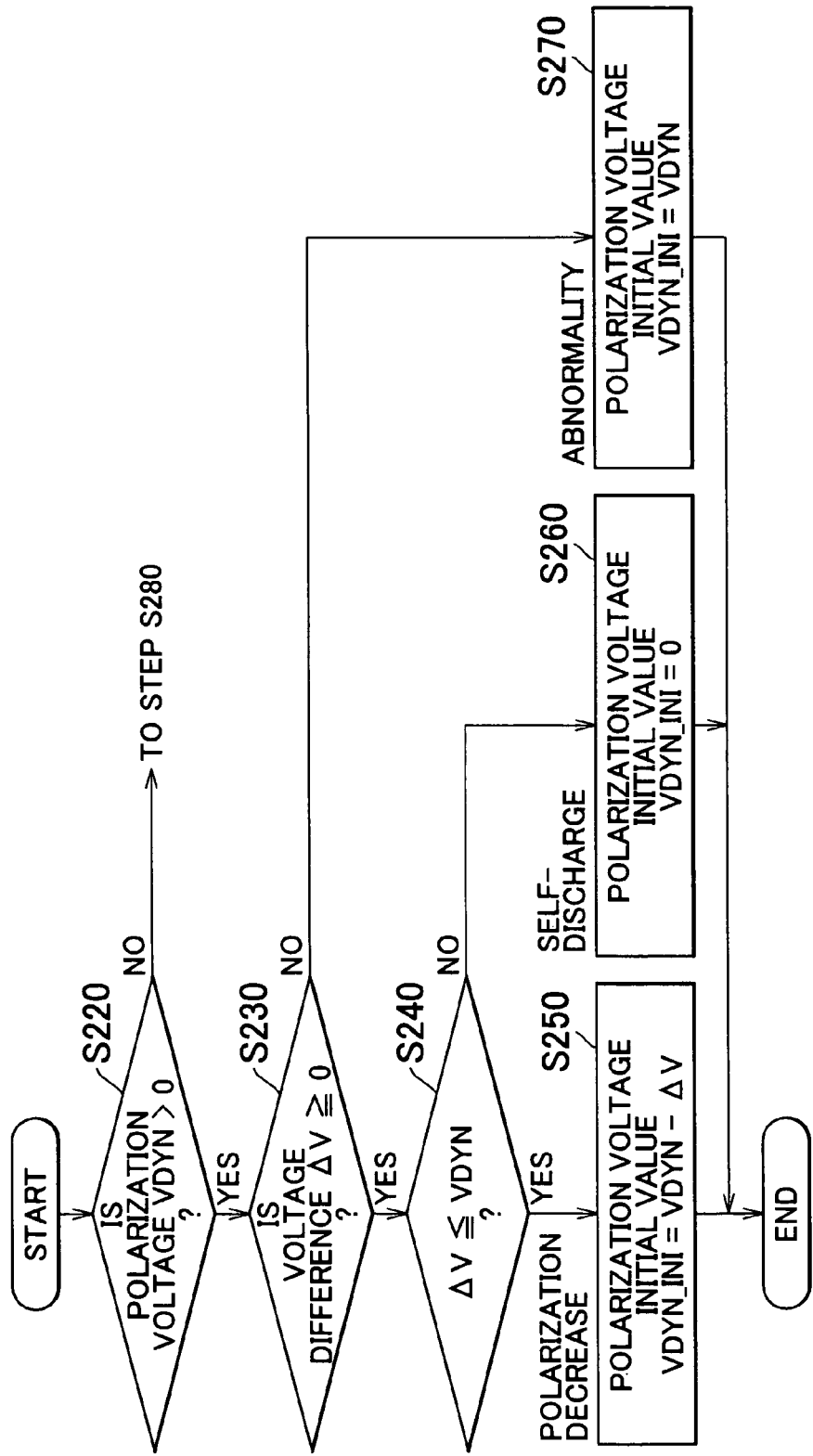
FIG. 14 is a second flowchart of the state-of-charge estimating method followed by the battery ECU according to the second exemplary embodiment of the invention.
Figure 15:
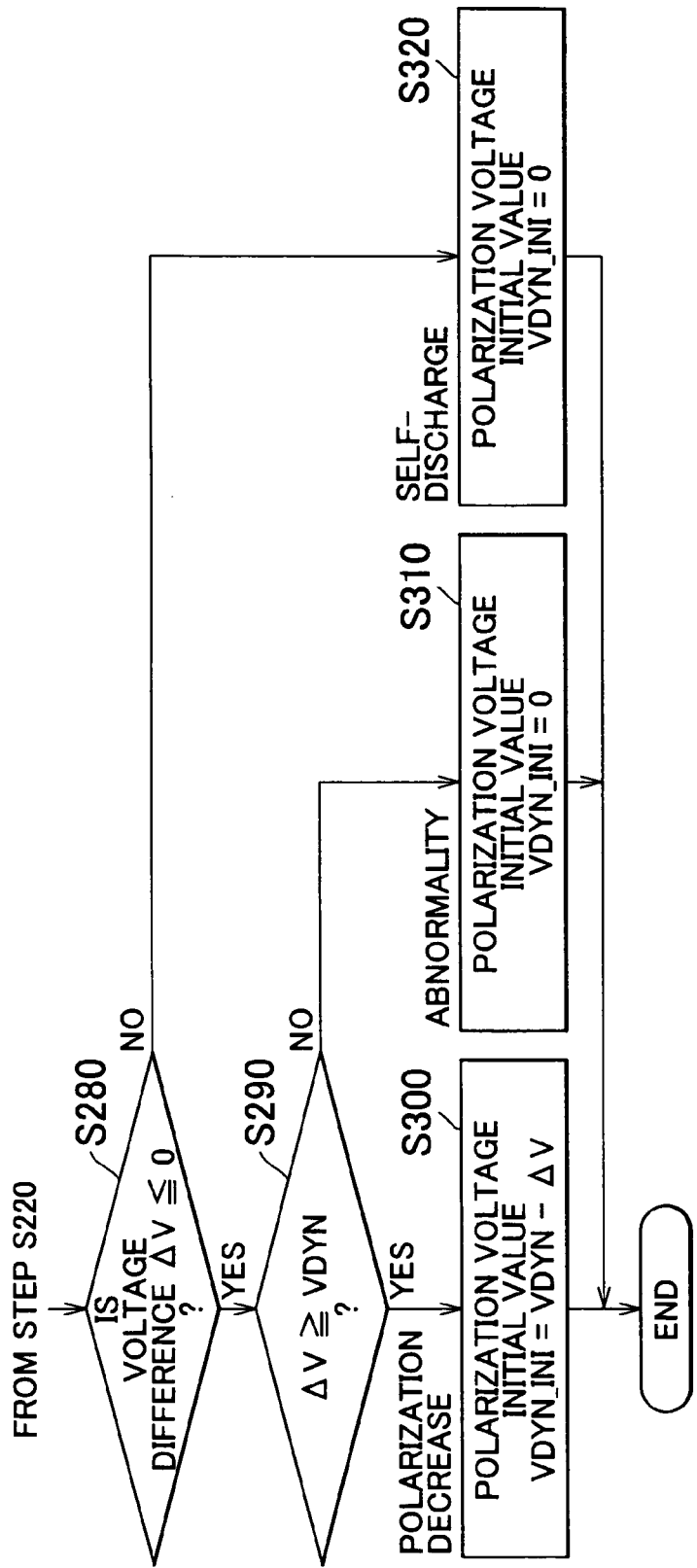
FIG. 15 is a third flowchart of the state-of-charge estimating method followed by the battery ECU according to the second exemplary embodiment of the invention.

FIGS. 13 to 15 are flowcharts of a state-of-charge estimating method followed by the battery ECU according to the second exemplary embodiment of the invention. The operation immediately before the not-in-use period when the ignition switch 22 is turned off is the same as the process flow in the first exemplary embodiment shown in FIG. 4.

Referring to FIG. 13, the process flow after the end of the not-in-use period has step S210 instead of steps S150 to S170 in the process flow according to the first exemplary embodiment shown in FIG. 5. After the CPU 32 calculates the voltage difference ΔV in step S140, it executes a polarization voltage initial value calculating routine (step S210). After the CPU 32 calculates the polarization voltage initial value VDYN_INI according to the polarization voltage initial value calculating routine, it then calculates the OCV in step S180.

FIG. 14 is a first flowchart of the polarization voltage initial value calculating routine in FIG. 13.

Referring to FIG. 14, the CPU 32 first confirms the sign of the polarization voltage VDYN before the not-in-use period read from the ROM 36 into the RAM 34 (step S220). If the polarization voltage VDYN is equal to, or less than, 0, the CPU 32 determines that the polarization is a discharge polarization and the process proceeds on to step S280 shown in FIG. 15, to be described later.

If the polarization voltage VDYN is positive, on the other hand, the CPU 32 determines that the polarization is a charge polarization and the process proceeds on to step S230, where the CPU 32 confirms the sign of the voltage difference ΔV calculated in step S140 shown in FIG. 13 (step S230). If the voltage difference ΔV is negative, the CPU 32 determines that there is an abnormality and sets the polarization voltage initial value VDYN_INI equal to the VDYN before the not-in-use period (step S270).

If the voltage difference ΔV in step S230 is equal to, or greater than, 0, on the other hand, the CPU 32 compares the voltage difference ΔV with the polarization voltage VDYN (step S240). If the voltage difference ΔV is equal to, or less than, the polarization voltage VDYN, the CPU 32 determines that the polarization voltage decreased by the voltage difference ΔV during the not-in-use period and sets the polarization voltage initial value VDYN_INI equal to VDYN−ΔV (step S250).

If the voltage difference ΔV is greater than the polarization voltage VDYN in step S240, the CPU 32 determines that the polarization voltage has disappeared, and further, that the secondary battery self-discharged during the not-in-use period so the CPU 32 sets the polarization voltage initial value VDYN_INI to 0 (step S260).

FIG. 15 is a second flowchart of the polarization voltage initial value calculating routine in FIG. 13.

Referring to FIG. 15, the CPU 32 first confirms the sign of the voltage difference ΔV (step S280). If the voltage difference ΔV is positive, the CPU 32 determines that the polarization voltage has disappeared, and further, that the secondary battery self-discharged during the not-in-use period so the CPU 32 sets the polarization voltage initial value VDYN_INI to 0 (step S320).

If the voltage difference ΔV is equal to, or less than, 0 in step S280, on the other hand, the CPU 32 compares the voltage difference ΔV with the polarization voltage VDYN (step S290). If the voltage difference ΔV is equal to, or greater than, the polarization voltage VDYN, the CPU 32 determines that the polarization voltage decreased by the voltage difference ΔV during the not-in-use period and sets the polarization voltage initial value VDYN_INI equal to VDYN−ΔV (step S300). If the voltage difference ΔV in step S290 is less than the polarization voltage VDYN, the CPU 32 determines that there is an abnormality and sets the polarization voltage initial value VDYN_INI to 0 (step S310).

In step S270, the polarization voltage initial value VDYN_INI when there is an abnormality may also be made equal to the difference of VDYN−ΔV or 0, as described above.

Also, the voltage detection before the not-in-use period may be done before the relay is turned off, and the value in which the voltage drop VR has been subtracted from the voltage detected when the relay was on may also be made equal to the battery voltage V1.

As described above, according to the second exemplary embodiment, exemplary embodiment, the polarization voltage after the not-in-use period is calculated using the voltage difference in the secondary battery before and after the not-in-use period. As a result, it is possible to estimate the SOC without having to provide a timer to time the not-in-use period, and thus at a low cost. Furthermore, the estimation accuracy of the OCV improves, which in turn improves the estimation accuracy of the SOC.

[Third Embodiment]

In the second exemplary embodiment, the polarization voltage after the not-in-use period is calculated using the voltage difference in the battery voltages before and after the not-in-use period, and the OCV and SOC are calculated based on that calculated polarization voltage. In the third exemplary embodiment, the OCV is used for the voltage before the not-in-use period.

This OCV before the not-in-use period can be calculated using Expression 1 above based on the battery voltage detected by the voltage sensor before the not-in-use period, and the polarization voltage. Further, the OCV can also be calculated back from the SOC before the not-in-use period using the OCV-SOC map. The former case is substantially the same as the case in the second exemplary embodiment. In the latter case, on the other hand, the OCV is calculated from the SOC, which is calculated by continually adding up the current. As a result, continuity in the SOC before and after the not-in-use period is able to be maintained. The decision as to which OCV to use may also be made at the design stage. They can also be made switchable at the product stage.

The structure of the power unit according to the third exemplary embodiment is the same as the structure of the power unit 10 according to the first exemplary embodiment.

FIGS. 16 to 19 are graphs illustrating the concept behind the state-of-charge estimating calculation according to the third exemplary embodiment of the invention. In the drawings, the polarization voltage VDYN before the not-in-use period is a positive value, i.e., a case of charge polarization is shown. Also, the period during time T1 to T2 in the drawings corresponds to a not-in-use period.

Figure 16:
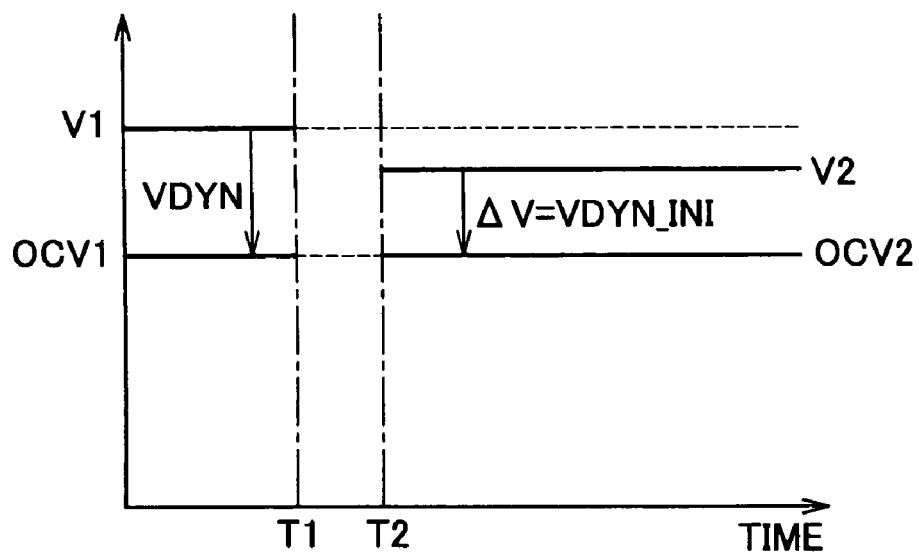
FIG. 16 is a is a graph illustrating the concept behind a state-of-charge estimating calculation according to a third exemplary embodiment of the invention when there is a charge polarization and the not-in-use period is short.

Referring to FIG. 16, the voltage difference ΔV between the battery voltage V2 after the not-in-use period and the open circuit voltage OCV1 before the not-in-use period is thought to be due to polarization so the polarization voltage VDYN_INI after the not-in-use period is set equal to the voltage difference ΔV. Therefore, the open circuit voltage OCV2 after the not-in-use period becomes equal to the difference of V2−VDYN_INI, i.e., V2−ΔV, and the SOC can be calculated from this OCV2 using the OCV-SOV map.

Figure 17:
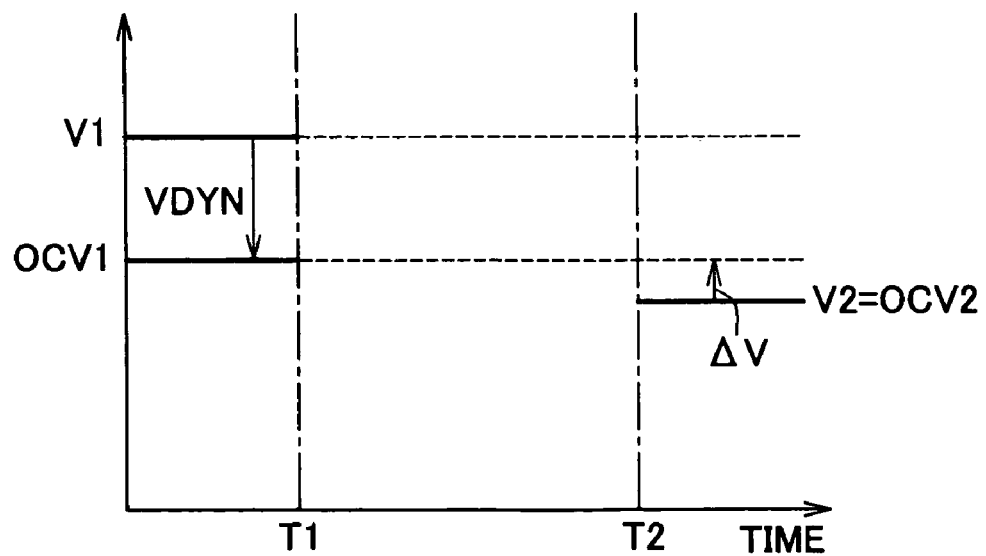
FIG. 17 is a graph illustrating the concept behind a state-of-charge estimating calculation according to the third exemplary embodiment of the invention when there is a charge polarization and the not-in-use period is long.

Referring to FIG. 17, however, when the voltage difference ΔV is negative, it is thought that the polarization voltage has disappeared, and further, that the secondary battery has self-discharged, so the polarization voltage VDYN_INI after the not-in-use period is made 0. Therefore, the open circuit voltage OCV2 after the not-in-use period becomes equal to V2, and the SOC can be calculated from this OCV2 using the OCV-SOV map.

Figure 18:
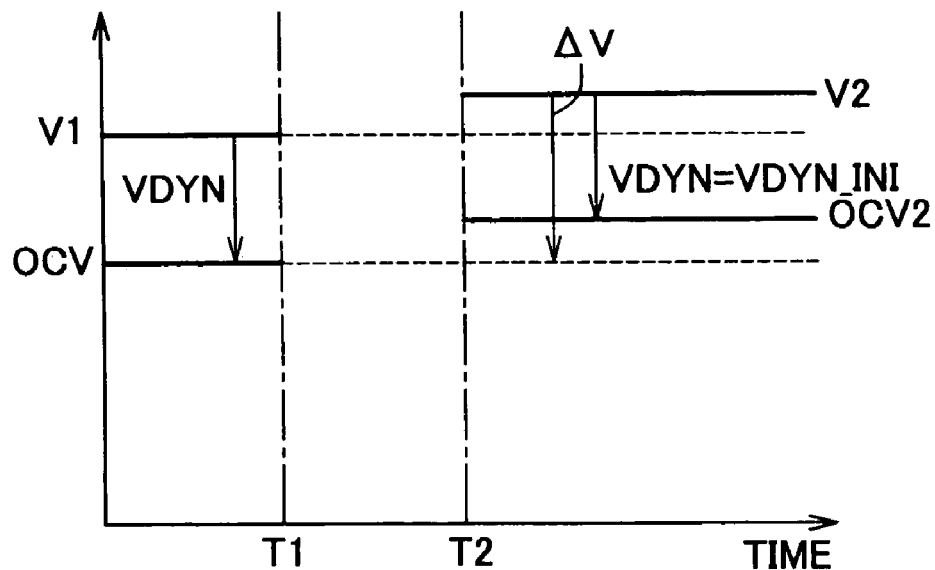
FIG. 18 is a graph illustrating the concept behind a state-of-charge estimating calculation according to the third exemplary embodiment of the invention when there is a charge polarization and an abnormality.
Figure 19:
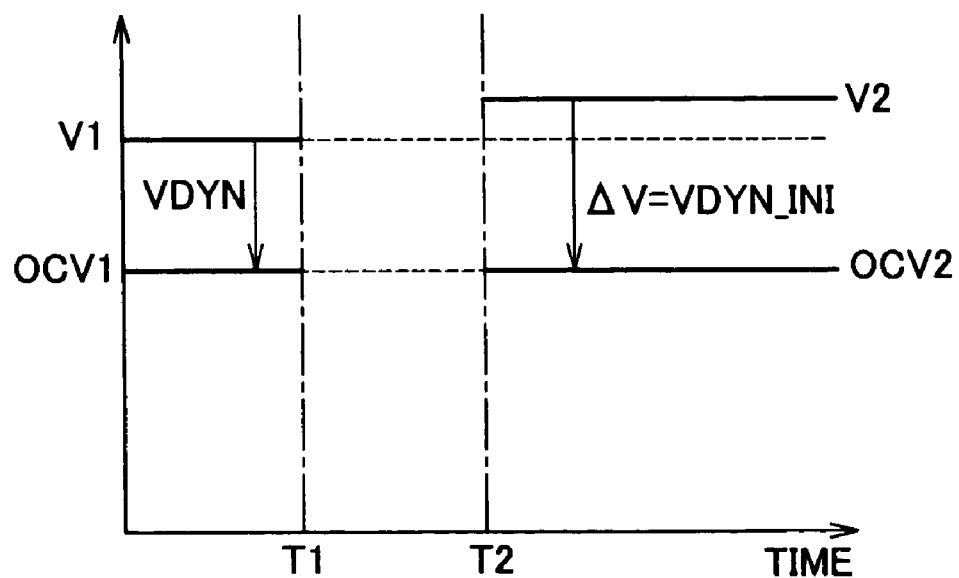
FIG. 19 is a graph illustrating another concept behind a state-of-charge estimating calculation according to the third exemplary embodiment of the invention when there is a charge polarization and an abnormality.

Referring to FIG. 18, on the other hand, a case in which the voltage difference ΔV is larger than the polarization voltage VDYN before the not-in-use period is ordinarily inconceivable so it is thought that some sort of abnormality has occurred. In this case, various countermeasures are possible. In FIG. 18, it is presumed that the polarization voltage before the not-in-use period is correct, so the polarization voltage VDYN_INI after the not-in-use period is set equal to VDYN. In FIG. 19, on the other hand, it is presumed that the OCV1 before the not-in-use period is correct, so the polarization voltage VDYN_INI after the not-in-use period is set equal to ΔV. Further, although not specifically shown, the polarization voltage VDYN_INI may also be reset to 0.

Figure 20:
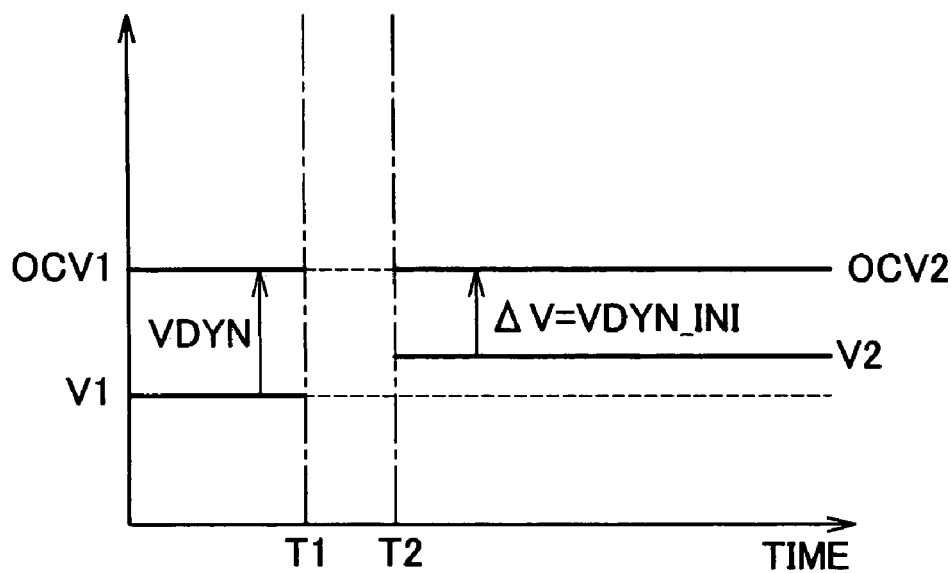
FIG. 20 is a graph illustrating the concept behind a state-of-charge estimating calculation according to the third exemplary embodiment of the invention when there is a discharge polarization and the not-in-use period is short.
Figure 21:
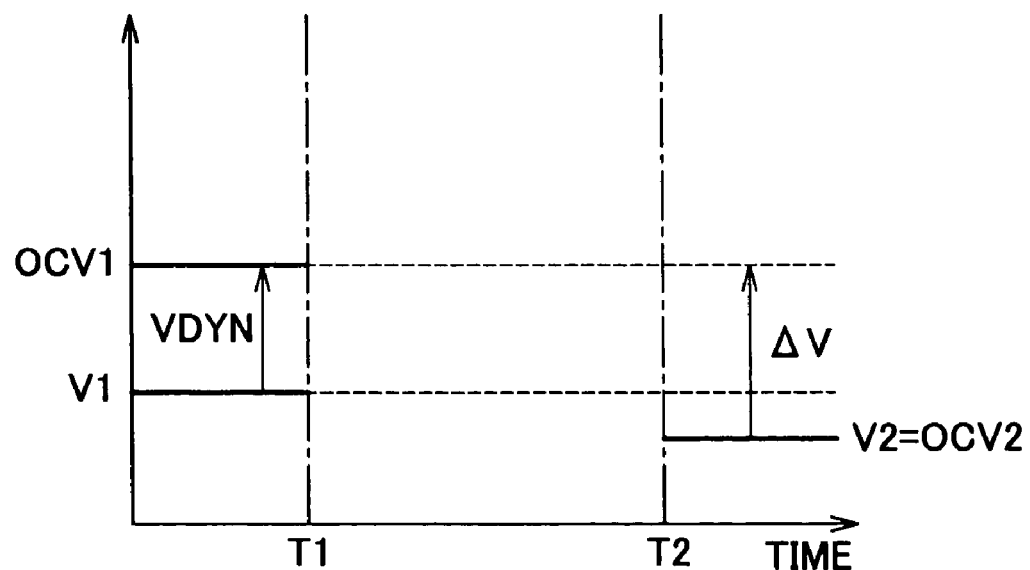
FIG. 21 is a graph illustrating the concept behind a state-of-charge estimating calculation according to the third exemplary embodiment of the invention when there is a discharge polarization and the not-in-use period is long.
Figure 22:
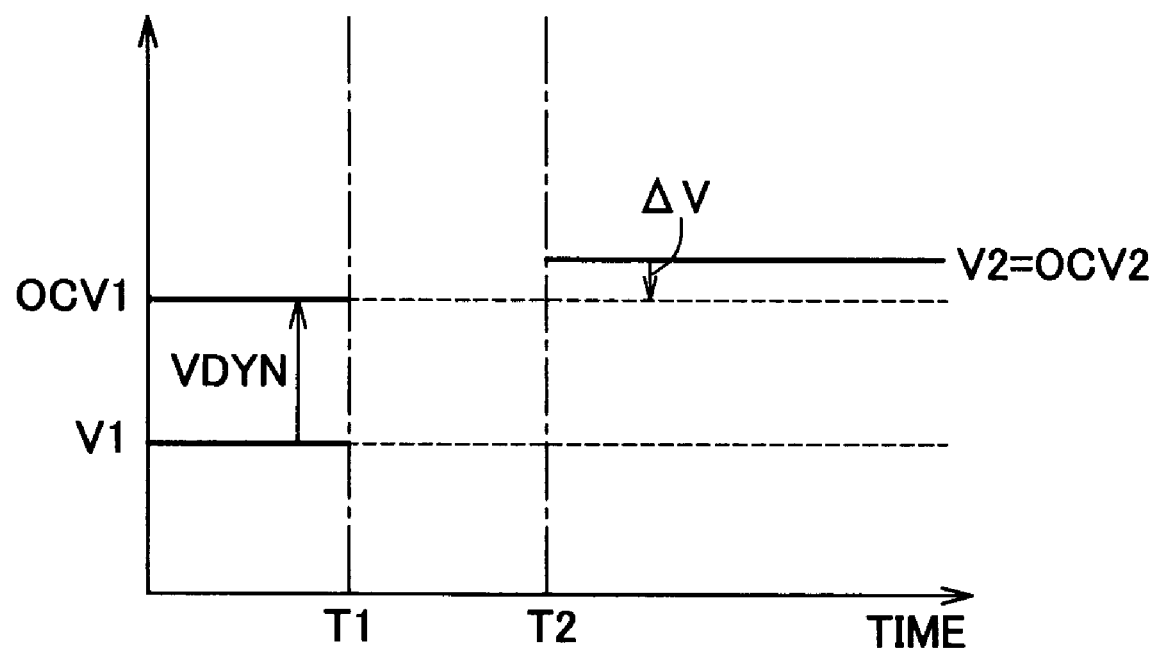
FIG. 22 is a graph illustrating the concept behind a state-of-charge estimating calculation according to the third exemplary embodiment of the invention when there is a discharge polarization and an abnormality.

FIGS. 20 to 22 are also graphs illustrating the concept behind the state-of-charge estimating calculation according to the third exemplary embodiment of the invention. In the drawings, the polarization voltage VDYN before the not-in-use period is a negative value, i.e., a case of discharge polarization is shown. Also, the period during time T1 to T2 in the drawings corresponds to a not-in-use period.

Referring to FIG. 20, the voltage difference ΔV between the battery voltage V2 and the open circuit voltage OCV1 is thought to be due to polarization so the polarization voltage VDYN_INI after the not-in-use period is set equal to the voltage difference ΔV. Therefore, the open circuit voltage OCV2 after the not-in-use period becomes equal to the difference of V2−VDYN_INI, i.e., V2−ΔV, and the SOC can be calculated from this OCV2 using the OCV-SOV map.

Referring to FIG. 21, however, when the voltage difference ΔV is less than the polarization voltage VDYN before the not-in-use period, it is thought that the polarization voltage has disappeared, and further, that the secondary battery has self-discharged, so the polarization voltage VDYN_INI after the not-in-use period is made 0. Therefore, the open circuit voltage OCV2 after the not-in-use period becomes equal to V2 and the SOC can be calculated from this OCV2 using the OCV-SOV map.

Referring to FIG. 22, on the other hand, a case in which the voltage difference ΔV is positive is ordinarily inconceivable so it is thought that some sort of abnormality has occurred. In this case, the polarization voltage VDYN_INI is reset to 0.

FIGS. 23 to 26 are flowcharts of the state-of-charge estimating method followed by the battery ECU according to the third exemplary embodiment of the invention.

Figure 23:
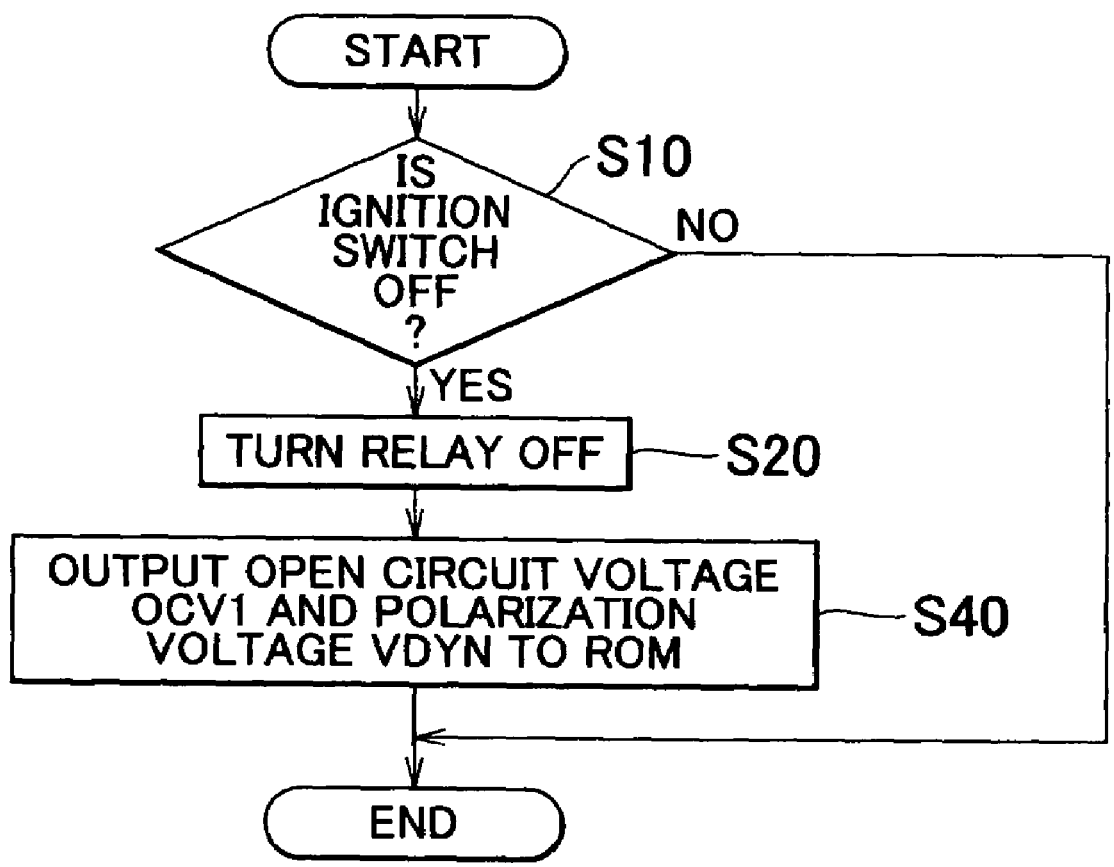
FIG. 23 is a first flowchart of a state-of-charge estimating method followed by the battery ECU according to the third exemplary embodiment of the invention.

Referring to FIG. 23, the process flow before the not-in-use period has step S40 instead of step S30 in the process flow according to the first exemplary embodiment shown in FIG. 4. When the CPU 32 turns off the relay connecting the secondary battery 12 with the vehicle power cable in step S20, it outputs the open circuit voltage OCV1 and the polarization voltage VDYN to the ROM 36 via the bus 40 (step S40) such that their values are then stored in the ROM 36.

Figure 24:
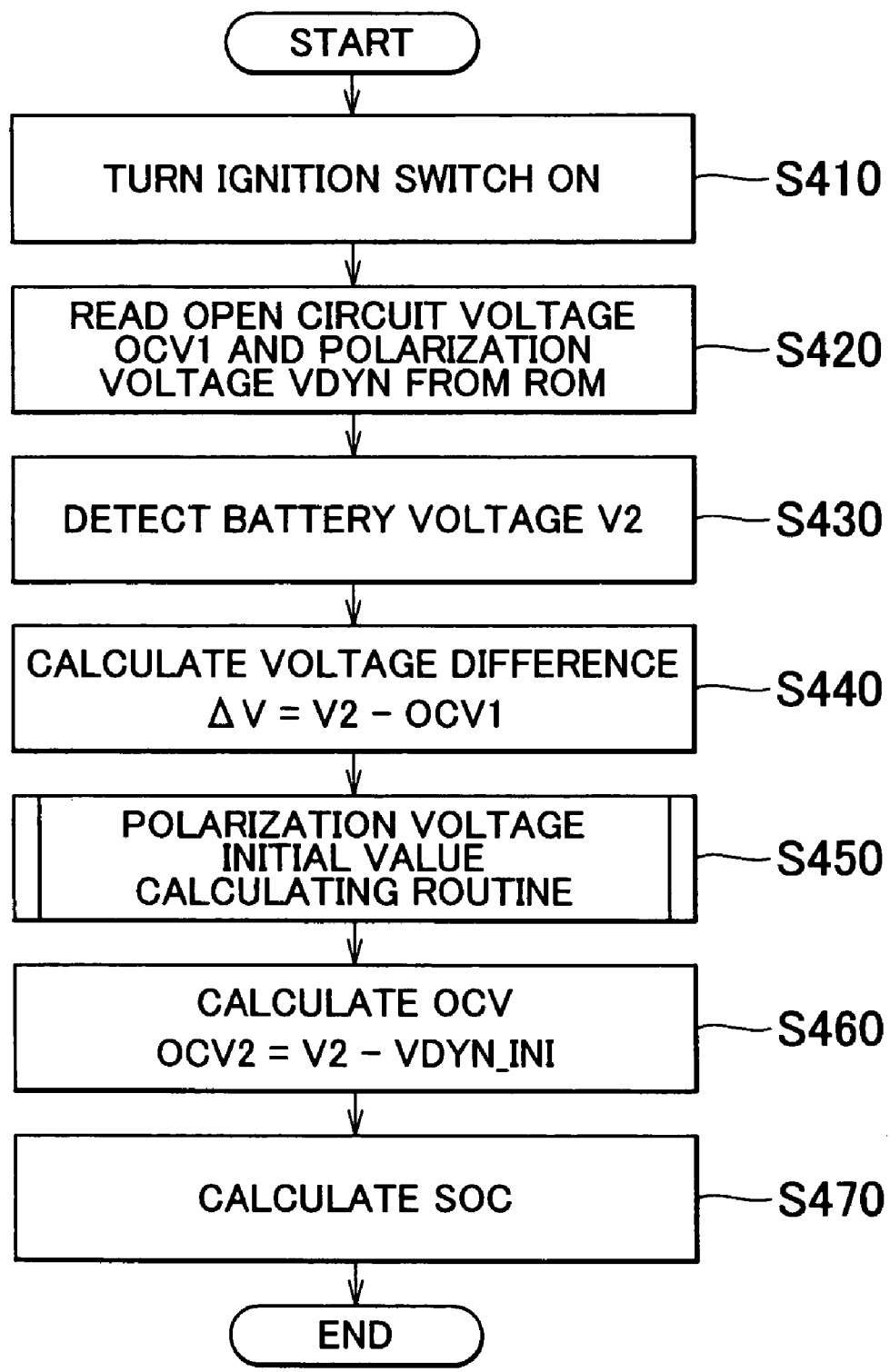
FIG. 24 is a second flowchart of the state-of-charge estimating method followed by the battery ECU according to the third exemplary embodiment of the invention.

Referring to FIG. 24, when the ignition switch 22 is turned on (step S410), the CPU 32 reads the open circuit voltage OCV1 and polarization voltage VDYN stored in the ROM 36 from the ROM 36 into the RAM 34 (step S420). Further, the CPU 32 obtains the battery voltage V2 detected by the voltage sensor 16 via the input/output interface 38, writes it into the RAM 34 (step S430), and calculates the voltage difference $\Delta V$ between the battery voltage V2 and the open circuit voltage OCV1 (step S440).

After calculating the voltage difference $\Delta V$, the CPU 32 then executes the polarization voltage initial value calculating routine (step S450). Then after the CPU 32 calculates the polarization voltage initial value VDYN_INI according to the polarization voltage initial value calculating routine, it calculates the OCV using that calculated polarization voltage initial value VDYN_INI and the battery voltage V2 (step S460). The CPU 32 then reads the OCV-SOC map from the ROM 36 into the RAM 34 and calculates the SOC from the calculated OCV (step S470).

Figure 25:
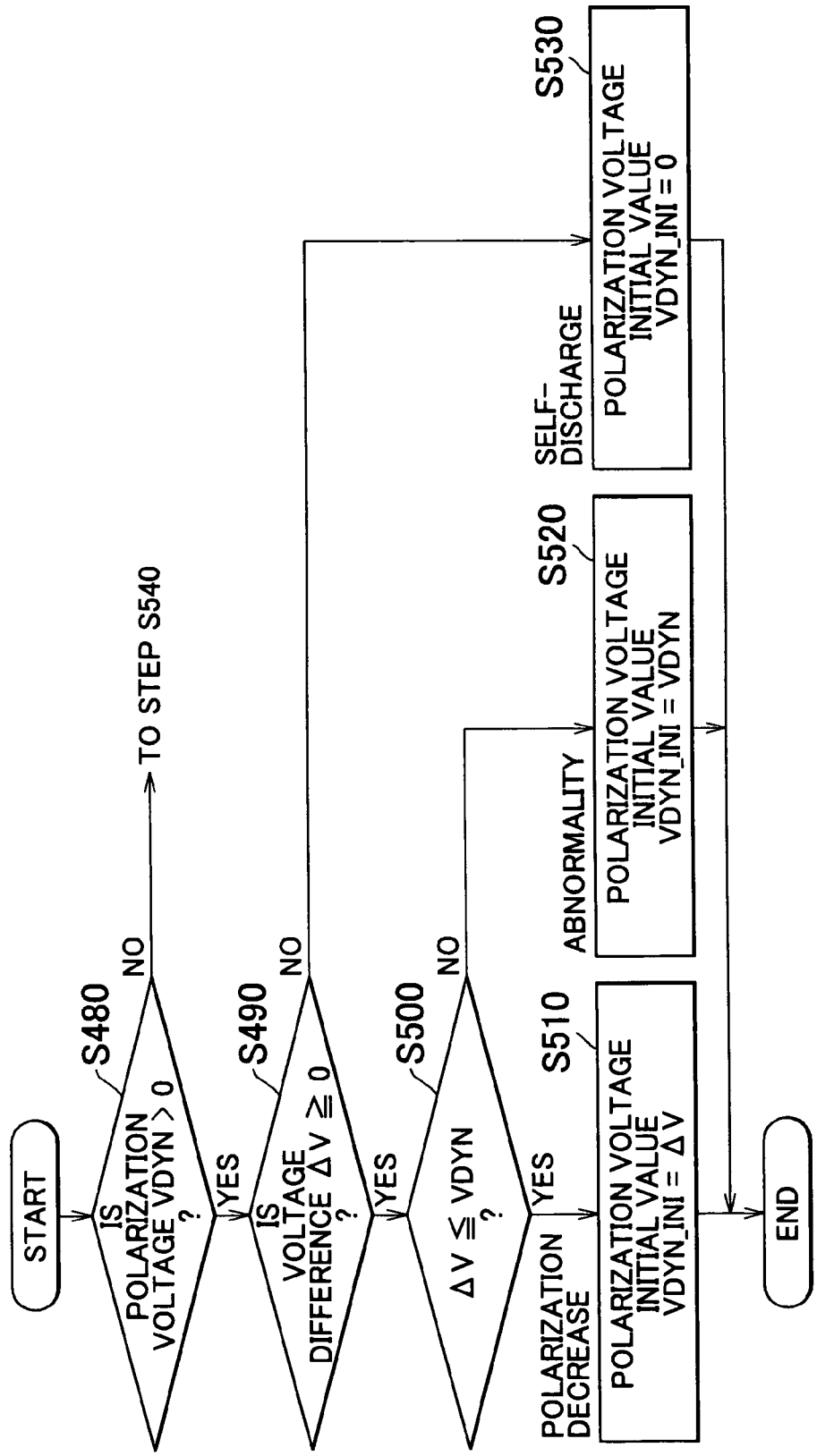
FIG. 25 is a third flowchart of the state-of-charge estimating method followed by the battery ECU according to the third exemplary embodiment of the invention.

FIG. 25 is a first flowchart of the polarization voltage initial value calculating routine in FIG. 24.

Referring to FIG. 25, the CPU 32 confirms the sign of the polarization voltage VDYN before the not-in-use period that was read from the ROM 36 into the RAM 34 (step S480). If the polarization voltage VDYN is equal to, or less than, 0, the CPU 32 determines that the polarization is a discharge polarization and the process proceeds on to step S540 in FIG. 26, to be described later.

If the polarization voltage VDYN is positive, on the other hand, the CPU 32 determines that the polarization is a charge polarization and the process proceeds on to step S490, where the CPU 32 confirms the sign of the voltage difference $\Delta V$ calculated in step S440 in FIG. 24 (step S490). If the voltage difference $\Delta V$ is negative, the CPU 32 determines that the polarization voltage disappeared, and further, that the secondary battery has self-discharged during the not-in-use period so the CPU 32 sets the polarization voltage initial value VDYN_INI to 0 (step S530).

If the voltage difference $\Delta V$ is equal to, or greater than, 0 in step S490, however, the CPU 32 compares the voltage difference $\Delta V$ with the polarization voltage VDYN (step S500). If the voltage difference $\Delta V$ is equal to, or less than, the polarization voltage VDYN, the CPU 32 determines that the voltage difference $\Delta V$ is due to polarization and sets the polarization voltage initial value VDYN_INI equal to $\Delta V$ (step S510).

If the polarization voltage VDYN is greater than the voltage difference $\Delta V$ in step S500, the CPU 32 determines that there is an abnormality and sets the polarization voltage initial value VDYN_INI equal to the VDYN before the not-in-use period (step S520).

Figure 26:
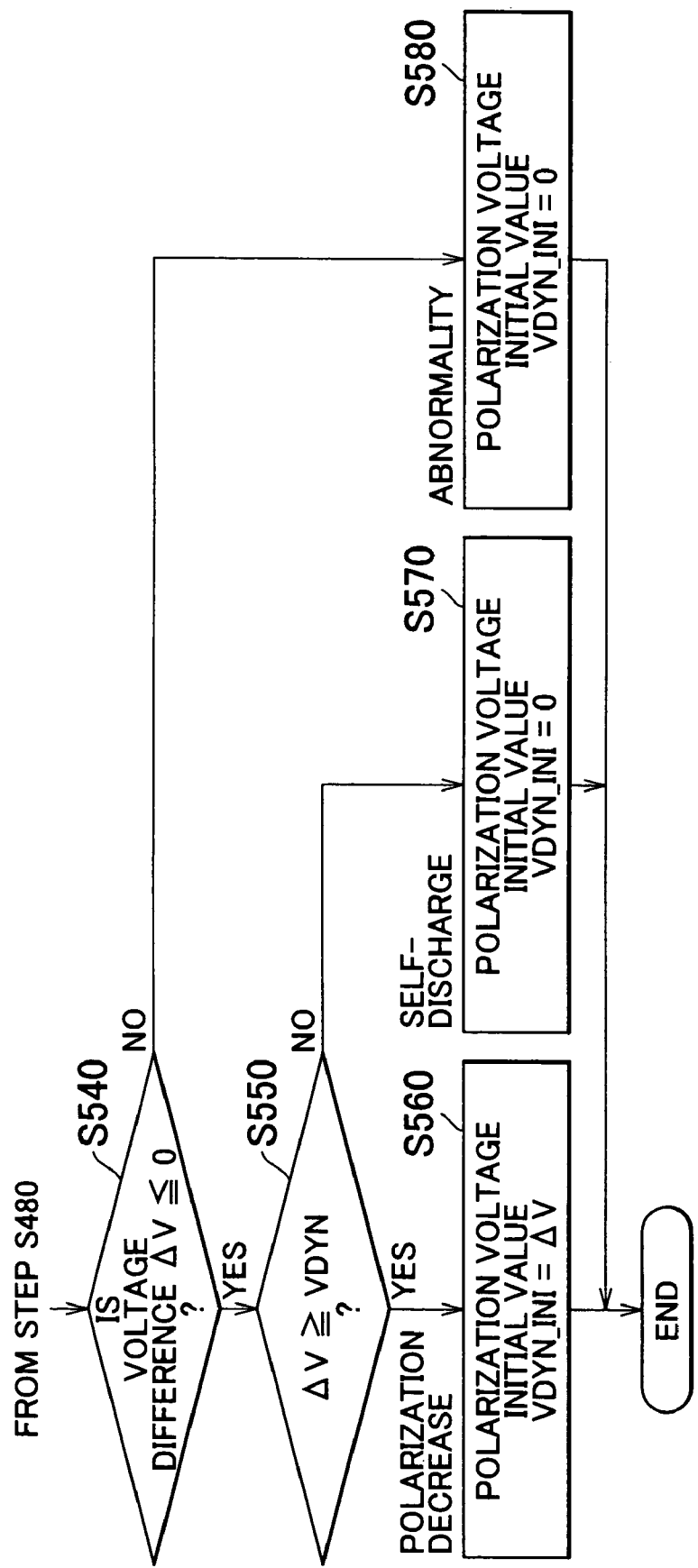
FIG. 26 is a fourth flowchart of the state-of-charge estimating method followed by the battery ECU according to the third exemplary embodiment of the invention.
Figure 27:
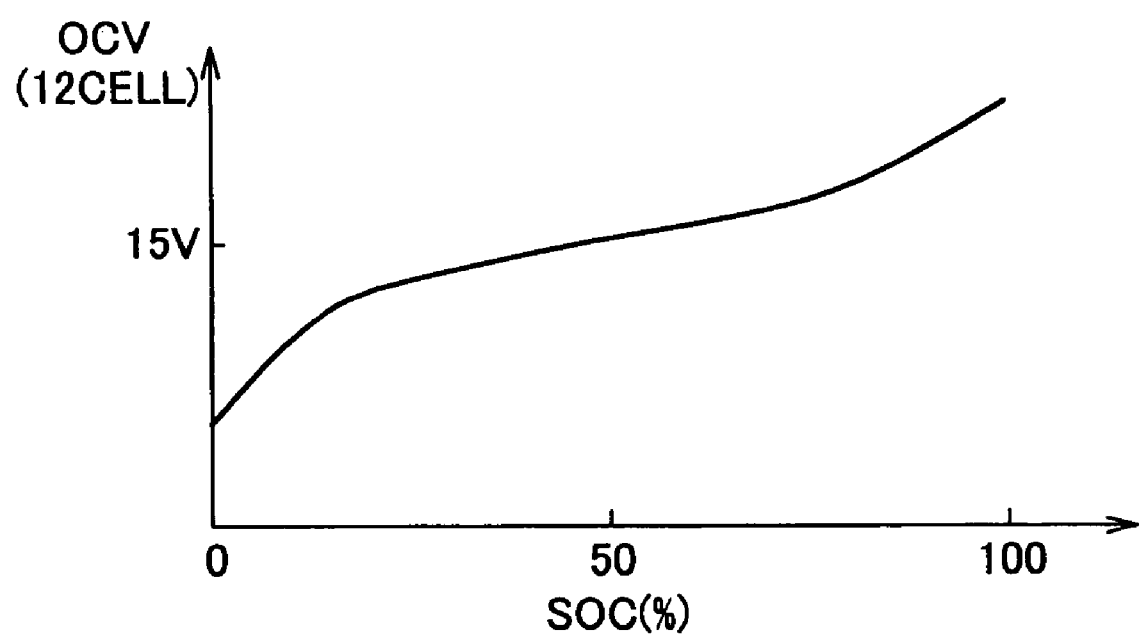
FIG. 27 is a graph showing the relationship between SOC and OCV.
Figure 28:
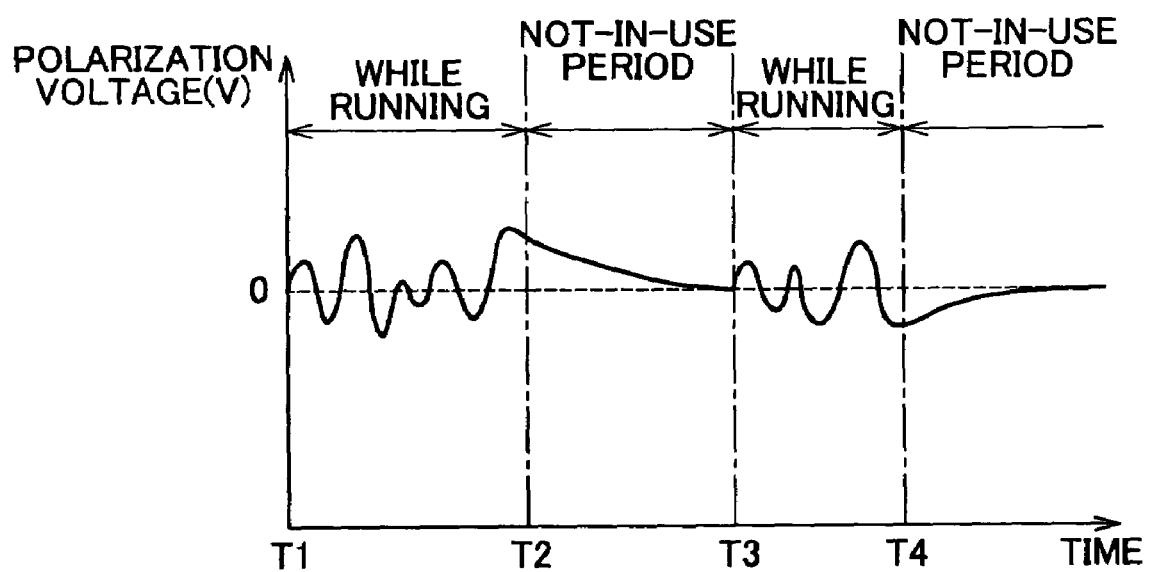
FIG. 28 is a graph illustrating the shift in the polarization voltage.

FIG. 26 is a second flowchart of the polarization voltage initial value calculating routine in FIG. 24.

Referring to FIG. 26, the CPU 32 confirms the sign of the voltage difference $\Delta V$ (step S540). If the voltage difference $\Delta V$ is positive, the CPU 32 determines that there is an abnormality and sets the polarization voltage initial value VDYN_INI to 0 (step S580).

If, on the other hand, the voltage difference $\Delta V$ is equal to, or less than, 0 in step S540, the CPU 32 compares the voltage difference $\Delta V$ with the polarization voltage VDYN (step S550). If the voltage difference $\Delta V$ is equal to, or greater than, the polarization voltage VDYN, the CPU 32 determines that the voltage difference $\Delta V$ is due to polarization and sets the polarization voltage initial value VDYN_INI equal to $\Delta V$ (step S560).

If the voltage difference $\Delta V$ is less than the polarization voltage VDYN in step S550, the CPU 32 determines that the polarization voltage disappeared, and further, that the secondary battery has self-discharged during the not-in-use period so the CPU 32 sets the polarization voltage initial value VDYN_INI to 0 (step S570).

As described above, in step S520 the polarization voltage initial value VDYN_INI may also be set equal to $\Delta V$ or 0.

Also, the point at which the open circuit voltage OCV1 before the not-in-use period is calculated may be the point at which the relay is turned on.

As described above, in the third exemplary embodiment as well, the polarization voltage after the not-in-use period is calculated based on the voltage difference before and after the not-in-use period. As a result, it is possible to estimate the SOC without having to provide a timer to time the not-in-use period, and thus at a low cost. Furthermore, the estimation accuracy of the OCV improves, which in turn improves the estimation accuracy of the SOC.

In the foregoing embodiments, the secondary battery 12 is a nickel metal hydride battery, but it is not limited to this, i.e., it may instead be a lithium battery or the like.

Also, each step in the flowcharts of the first through the third exemplary embodiments is recorded in the ROM 36. The CPU 32 reads the program that includes the steps from the ROM 36, executes the read program, and calculates the SOC following the flowcharts. Therefore, the ROM 36 corresponds to the recording medium readable by a computer in which is stored a program that includes each of the steps executed by the CPU 32.

While the invention has been described with reference to exemplary embodiments thereof, it is to be understood that the invention is not limited to the exemplary embodiments or constructions. To the contrary, the invention is intended to cover various modifications and equivalent arrangements. In addition, while the various elements of the exemplary embodiments are shown in various combinations and configurations, which are exemplary, other combinations and configurations, including more, less or only a single element, are also within the spirit and scope of the invention.

According to each of the foregoing exemplary embodiments, because the polarization voltage after the not-in-use period is calculated based on the voltage difference of the secondary battery before and after the not-in-use period, it is possible to estimate the SOC without having to provide a timer for timing the not-in-use period, and thus at a low cost.

What is claimed is:

1. A secondary battery state-of-charge estimating apparatus comprising:
   a calculating portion which first calculates a second polarization voltage of a secondary battery at the start of operation of the secondary battery after a not-in-use period based on i) an amount of change in voltage in the secondary battery during the not-in-use period of the secondary battery, and ii) a first polarization voltage of the secondary battery when the secondary battery is operated, and then calculates the state-of-charge of the secondary battery at the start of operation using the second polarization voltage.

2. The apparatus according to claim 1, wherein the first polarization voltage is the polarization voltage at the end of operation of the secondary battery.

3. The apparatus according to claim 1, further comprising:
a voltage detecting portion that detects a battery voltage generated between terminals of the secondary battery; and
a storage portion that stores i) a first battery voltage detected by the voltage detecting portion at the end of operation of the secondary battery, and ii) the first polarization voltage,
wherein the calculating portion is configured to calculate the second polarization voltage based on i) a voltage difference between the first battery voltage stored in the storage portion and a second battery voltage detected by the voltage detecting portion at the start of operation, and ii) the first polarization voltage stored in the storage portion.

4. The apparatus according to claim 3, wherein the calculating portion is configured to set the value of the second polarization voltage to the value of the first polarization voltage when an absolute value of the voltage difference is less than a predetermined value.

5. The apparatus according to claim 3, wherein the calculating portion is configured to set the value of the second polarization voltage to 0 when an absolute value of the voltage difference is equal to, or greater than, a predetermined value.

6. The apparatus according to claim 3, wherein the calculating portion is configured to set the value of the second polarization voltage to a difference value between the first polarization voltage and the voltage difference when a first or second condition is fulfilled, the first condition being that the first polarization voltage is a positive value and the voltage difference is equal to, or greater than, 0 and equal to, or less than, a predetermined value and the second condition being that the first polarization voltage is equal to, or less than, 0 and the voltage difference is equal to, or less than, 0 and equal to, or greater than, the predetermined value.

7. The apparatus according to claim 6, wherein the predetermined value is the value of the first polarization voltage.

8. The apparatus according to claim 3, wherein the calculating portion is configured to set the second polarization voltage to 0 when a first or second condition is fulfilled, the first condition being that the first polarization voltage is a positive value and the voltage difference is equal to, or greater than, 0 and greater than a predetermined value and the second condition being that the first polarization voltage is equal to, or less than, 0 and the voltage difference is a positive value.

9. The apparatus according to claim 8, wherein the predetermined value is the value of the first polarization voltage.

10. The apparatus according to claim 3, wherein the calculating portion includes a determining portion that determines whether there is an abnormality in the secondary battery, and the determining portion is configured to determine that there is an abnormality in the secondary battery when a first or second condition is fulfilled, the first condition being that the first polarization voltage is a positive value and the voltage difference is a negative value and the second condition being that the first polarization voltage is equal to, or less than, 0 and the voltage difference is equal to, or less than, 0 and less than a predetermined value.

11. The apparatus according to claim 10, wherein the predetermined value is the value of the first polarization voltage.

12. The apparatus according to claim 1, further comprising:
a voltage detecting portion that detects a battery voltage generated between terminals of the secondary battery; and
a storage portion that stores the first polarization voltage and an open circuit voltage of the secondary battery at the end of operation of the second battery,
wherein the calculating portion is configured to calculate the second polarization voltage based on i) a voltage difference between a second battery voltage detected by the voltage detecting portion at the start of operation and the open circuit voltage stored in the storage portion, and ii) the first polarization voltage stored in the storage portion.

13. The apparatus according to claim 12, wherein the calculating portion is configured to set the value of the second polarization voltage to the value of the voltage difference when a first or second condition is fulfilled, the first condition being that the first polarization voltage is a positive value and the voltage difference is equal to, or greater than, 0 and equal to, or less than, a predetermined value and the second condition being that the first polarization voltage is equal to, or less than, 0 and the voltage difference is equal to, or less than, 0 and equal to, or greater than, the predetermined value.

14. The apparatus according to claim 13, wherein the predetermined value is the value of the first polarization voltage.

15. The apparatus according to claim 12, wherein the calculating portion is configured to set the second polarization voltage to 0 when a first or second condition is fulfilled, the first condition being that the first polarization voltage is a positive value and the voltage difference is a negative value and the second condition being that the first polarization voltage is equal to, or less than, 0 and the voltage difference is equal to, or less than, 0 and less than a predetermined value.

16. The apparatus according to claim 15, wherein the predetermined value is the value of the first polarization voltage.

17. The apparatus according to claim 12, wherein the calculating portion includes a determining portion that determines whether there is an abnormality in the secondary battery, and the determining portion is configured to determine that there is an abnormality in the secondary battery when a first or second condition is fulfilled, the first condition being that the first polarization voltage is a positive value and the voltage difference is equal to, or greater than, 0 and greater than a predetermined value and the second condition being that the first polarization voltage is equal to, or less than, 0 and the voltage difference is a positive value.

18. The apparatus according to claim 17, wherein the predetermined value is the value of the first polarization voltage.

19. The apparatus according to claim 1, wherein the secondary battery is mounted in an electric vehicle or a hybrid vehicle and the not-in-use period is a period during which the electric vehicle or the hybrid vehicle is not in use.

20. A secondary battery state-of-charge estimating method comprising the steps of:
1) detecting a first battery voltage generated between terminals of a secondary battery at the end of operation of the secondary battery;
2) detecting a second battery voltage generated between the terminals at the start of operation after a not-in-use period of the secondary battery;

3) calculating a voltage difference between the first and second battery voltages;
4) calculating a second polarization voltage of the secondary battery at the start of operation based on the voltage difference and a first polarization voltage of the secondary battery at the end of operation; and
5) calculating a state-of-charge of the secondary battery at the start of operation using the second polarization voltage.

21. The method according to claim 20, wherein step 4 includes the sub-steps of:
4a) making the value of the second polarization voltage equal to a difference value between the first polarization voltage and the voltage difference when the first polarization voltage is a positive value and the voltage difference is equal to, or greater than, 0 and equal to, or less than, a predetermined value; and
4b) making the value of the second polarization voltage equal to the difference value when the first polarization voltage is equal to, or less than, 0 and the voltage difference is equal to, or less than, 0 and equal to, or greater than, the predetermined value.

22. The method according to claim 21, wherein the predetermined value is the value of the first polarization voltage.

23. The method according to claim 20, wherein step 4 includes the sub-steps of:
4a) making the second polarization voltage 0 when the first polarization voltage is a positive value and the voltage difference is equal to, or greater than, 0 and greater than a predetermined value; and
4b) making the second polarization voltage 0 when the first polarization voltage is equal to, or less than, 0 and the voltage difference is a positive value.

24. The method according to claim 23, wherein the predetermined value is the value of the first polarization voltage.

25. The method according to claim 20, further comprising the steps of:
6) determining that there is an abnormality in the secondary battery when the first polarization voltage is a positive value and the voltage difference is a negative value; and
7) determining that there is an abnormality in the secondary battery when the first polarization voltage is equal to, or less than, 0 and the voltage difference is equal to, or less than, 0 and less than a predetermined value.

26. The method according to claim 25, wherein the predetermined value is the value of the first polarization voltage.

27. A secondary battery state-of-charge estimating method comprising the steps of:
1) detecting a battery voltage generated between terminals of a secondary battery at the start of operation after a not-in-use period of the secondary battery;
2) calculating a voltage difference between the battery voltage and an open circuit voltage of the secondary battery at the end of operation of the secondary battery;
3) calculating a second polarization voltage of the secondary battery at the start of operation based on the voltage difference and the first polarization voltage of the secondary battery at the end of operation; and
4) calculating a state-of-charge of the secondary battery at the start of operation using the second polarization voltage.

28. The method according to claim 27, wherein step 3 comprises the sub-steps of:
3a) making the value of the second polarization voltage equal to the value of the voltage difference when the first polarization voltage is a positive value and the voltage difference is equal to, or greater than, 0 and equal to, or less than, a predetermined value; and
3b) making the value of the second polarization voltage equal to the value of the voltage difference when the first polarization voltage is equal to, or less than, 0 and the voltage difference is equal to, or less than, 0 and equal to, or greater than, the predetermined value.

29. The method according to claim 28, wherein the predetermined value is the value of the first polarization voltage.

30. The method according to claim 27, wherein step 3 comprises the sub-steps of:
3a) making the second polarization voltage 0 when the first polarization voltage is a positive value and the voltage difference is a negative value; and
3b) making the second polarization voltage 0 when the first polarization voltage is equal to, or less than, 0 and the voltage difference is equal to, or less than, 0 and less than a predetermined value.

31. The method according to claim 30, wherein the predetermined value is the value of the first polarization voltage.

32. The method according to claim 27, further comprising the steps of:
5) determining that there is an abnormality in the secondary battery when the first polarization voltage is a positive value and the voltage difference is a equal to, or greater than, 0 and greater than a predetermined value; and
6) determining that there is an abnormality in the secondary battery when the first polarization voltage is equal to, or less than, 0 and the voltage difference is a positive value.

33. The method according to claim 32, wherein the predetermined value is the value of the first polarization voltage.

34. A recording medium readable by a computer n which is stored a program for directing the computer to execute the steps in the method according to claim 20.

35. A recording medium readable by a computer in which is stored a program for directing the computer to execute the steps in the method according to claim 27.

* * * * *